United States Patent
Ueno et al.

(10) Patent No.: US 11,876,006 B2
(45) Date of Patent: Jan. 16, 2024

(54) HEAT TREATMENT METHOD AND HEAT TREATMENT APPARATUS OF LIGHT IRRADIATION TYPE

(71) Applicant: SCREEN Holdings Co., Ltd., Kyoto (JP)

(72) Inventors: Tomohiro Ueno, Kyoto (JP); Takahiro Kitazawa, Kyoto (JP); Yoshihide Nozaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 154 days.

(21) Appl. No.: 16/918,049

(22) Filed: Jul. 1, 2020

(65) Prior Publication Data

US 2021/0057245 A1 Feb. 25, 2021

(30) Foreign Application Priority Data

Aug. 22, 2019 (JP) .................................. 2019-151893

(51) Int. Cl.
*H01L 21/268* (2006.01)
*H01L 21/324* (2006.01)
(Continued)

(52) U.S. Cl.
CPC ...... *H01L 21/67248* (2013.01); *G01J 5/0007* (2013.01); *H01L 21/2636* (2013.01);
(Continued)

(58) Field of Classification Search
CPC ............. H01L 21/324; H01L 21/67115; H01L 21/67248; H01L 21/68707; H01L 21/2636; H01L 21/2686; G01J 5/0007
See application file for complete search history.

(56) References Cited

U.S. PATENT DOCUMENTS 5,165,791 A 11/1992 Miki et al.
10,643,869 B2 * 5/2020 Kitazawa .......... H01L 21/68707
(Continued)

FOREIGN PATENT DOCUMENTS

CN 112349587 * 2/2021 ........ H01L 21/67115
DE 10 2012 005 428 * 10/2014 ................ G01J 5/00
(Continued)

OTHER PUBLICATIONS

Office Action and Search Report dated Sep. 2, 2021 in corresponding Taiwanese Patent Application No. 109121249 with English translation made from Japanese translation of the original communication.
(Continued)

*Primary Examiner* — Mary A Wilczewski
(74) *Attorney, Agent, or Firm* — OSTROLENK FABER LLP

(57) ABSTRACT

Film information about a thin film formed on the front surface of a semiconductor wafer, substrate information about the semiconductor wafer, and an installation angle of an upper radiation thermometer are set and input. Emissivity of the front surface of the semiconductor wafer formed with a multilayer film is calculated based on the various kinds of information. Further, a weighted average efficiency of the emissivity of the front surface of the semiconductor wafer is determined based on a sensitivity distribution of the upper radiation thermometer. Front surface temperature of the semiconductor wafer at the time of heat treatment is measured using the determined weighted average efficiency of the emissivity. The emissivity is determined based on the film information and the like, so that the front surface temperature of the semiconductor wafer can be accurately measured even when thin films are formed in multiple layers.

3 Claims, 16 Drawing Sheets

(51) Int. Cl.
*H01L 21/263* (2006.01)
*G01J 5/00* (2022.01)
*H01L 21/67* (2006.01)
*H01L 21/687* (2006.01)

(52) U.S. Cl.
CPC ........ *H01L 21/2686* (2013.01); *H01L 21/324* (2013.01); *H01L 21/67115* (2013.01); *H01L 21/68707* (2013.01)

(56) References Cited

U.S. PATENT DOCUMENTS

| | | | |
|---|---|---|---|
| 10,658,250 B2 * | 5/2020 | Kawarazaki | H01L 21/2686 |
| 10,903,126 B2 * | 1/2021 | Kawarazaki | H01L 21/67739 |
| 11,476,167 B2 * | 10/2022 | Kitazawa | H01L 21/2686 |
| 2005/0018196 A1 | 1/2005 | Kusuda | 356/448 |
| 2012/0076477 A1 | 3/2012 | Kuroiwa | |
| 2012/0288970 A1 | 11/2012 | Hashimoto et al. | 438/16 |
| 2017/0053818 A1 * | 2/2017 | Aoyama | H01L 21/67248 |
| 2017/0178979 A1 | 6/2017 | Furukawa et al. | |
| 2018/0240689 A1 * | 8/2018 | Kitazawa | H01L 21/681 |
| 2018/0254224 A1 * | 9/2018 | Kitazawa | H01L 21/2686 |
| 2018/0269085 A1 | 9/2018 | Fuse et al. | |
| 2019/0006215 A1 | 1/2019 | Aoyama et al. | |
| 2019/0157168 A1 * | 5/2019 | Kawarazaki | H01L 21/324 |
| 2021/0057245 A1 * | 2/2021 | Ueno | H01L 21/68707 |
| 2021/0159111 A1 * | 5/2021 | Prengle | H01L 21/6875 |
| 2021/0327771 A1 * | 10/2021 | Kitazawa | H01L 21/67115 |

FOREIGN PATENT DOCUMENTS

| | | | | |
|---|---|---|---|---|
| JP | H04-125433 A | | 4/1992 | |
| JP | H10-321539 A | | 12/1998 | |
| JP | H11-160028 A | | 6/1999 | |
| JP | 2005-039213 A | | 2/2005 | |
| JP | 2006-90978 | * | 4/2006 | H01L 21/31 |
| JP | 4056148 | * | 3/2008 | G01J 5/00 |
| JP | 2008-235858 | * | 10/2008 | H01L 21/26 |
| JP | 2011-080790 A | | 4/2011 | |
| JP | 2012-074430 A | | 4/2012 | |
| JP | 2012-238779 A | | 12/2012 | |
| JP | 2017-041468 A | | 2/2017 | |
| JP | 2018-130728 A | | 8/2018 | |
| JP | 2018-157064 A | | 10/2018 | |
| JP | 2019-129292 A | | 8/2019 | |
| JP | 2020-128981 | * | 8/2020 | G01J 5/10 |
| JP | 2021-34505 | * | 3/2021 | H01L 21/67115 |
| JP | 2021-182582 | * | 11/2021 | H01L 21/67115 |
| KR | 10-2002-0096261 A | | 12/2002 | |
| KR | 10-2018-0096501 A | | 8/2018 | |
| TW | 201724266 A | | 7/2017 | |
| TW | 201906012 A | | 2/2019 | |
| WO | WO 97/34318 | * | 9/1997 | H01L 21/67115 |

OTHER PUBLICATIONS

Patent Rejection Decision Document dated May 28, 2022 in counterpart Korean Patent Application No. 10-2020-0104602 and English translation obtained from One Portal Dossier.
Notification of Reason for Refusal dated Dec. 10, 2021 in corresponding Korean Patent Application No. 10-2020-0104602 and machine-generated English translation thereof obtained from the JPO.
Notice of Final Rejection dated Sep. 8, 2022 in corresponding Korean Patent Application No. 10-2020-0104602 and computer generated English translation obtained from the JPO.
Notice of Reasons for Refusal dated May 2, 2023 in corresponding Japanese Patent Application No. 2019-151893 and a computer generated English language translation obtained from the JPO.

* cited by examiner

F I G. 5
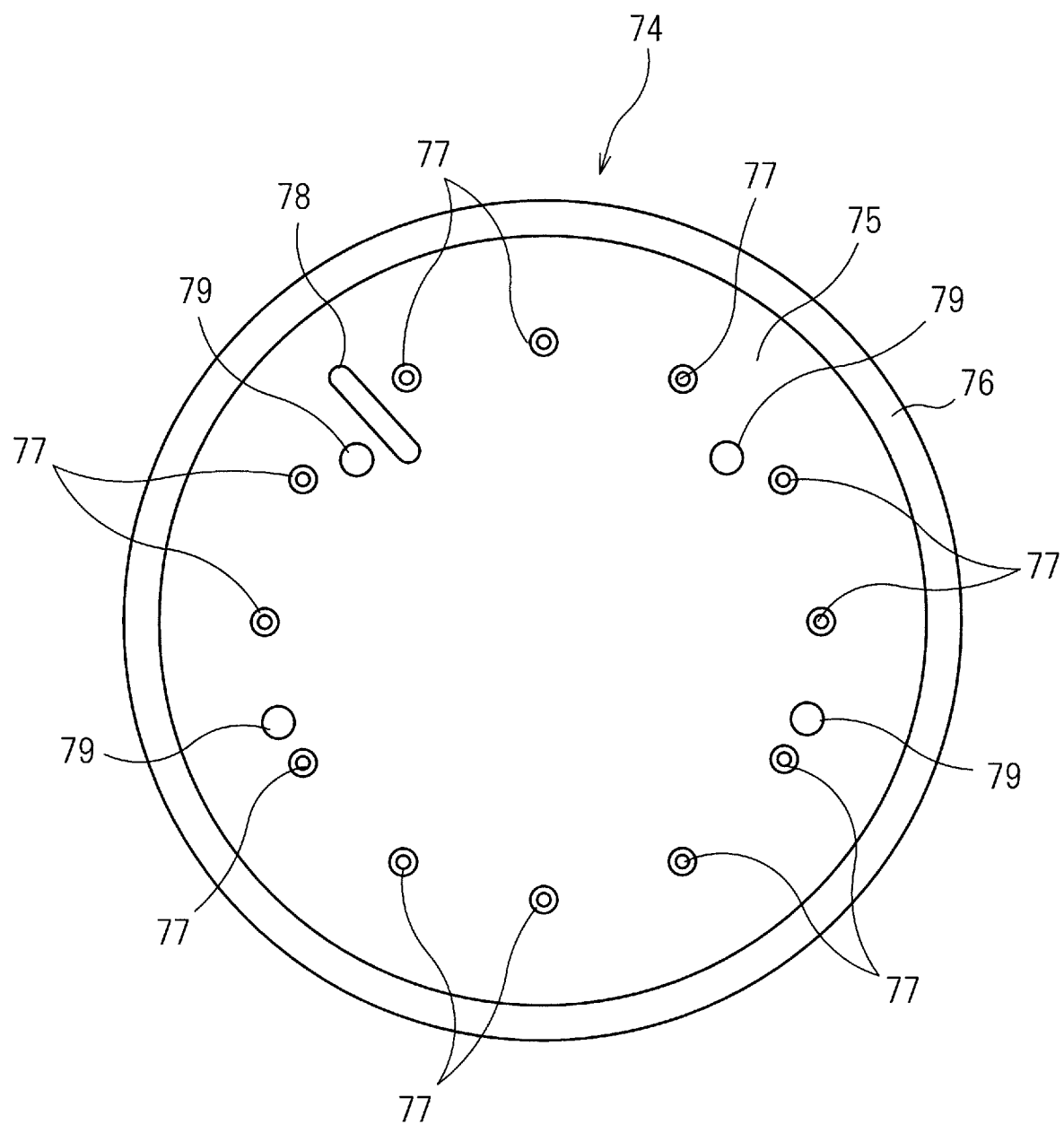

F I G . 6
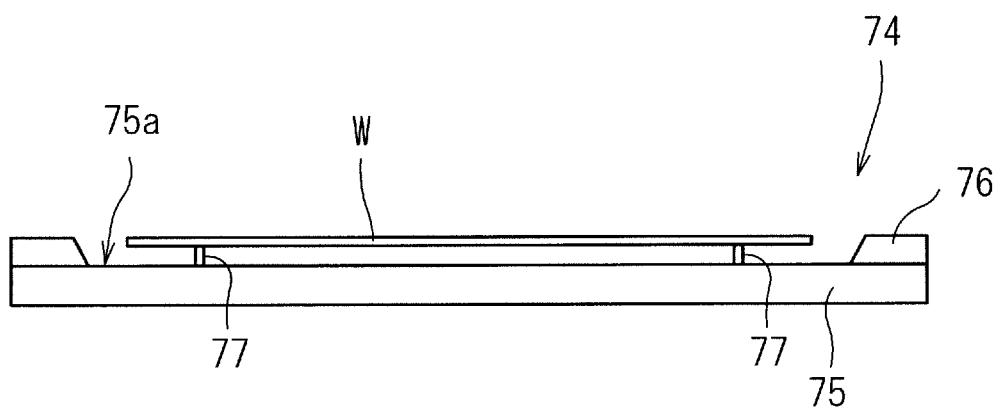

FIG. 12

| | Type | Thin[nm] | | | |
|---|---|---|---|---|---|
| Layer4 | SiN ▼ | 15 | Angle | 80 | degree |
| Layer3 | Sio2 ▼ | 15 | Cycle time | 25 | |
| Layer2 | SiN ▼ | 15 | | | |
| Layer1 | Sio2 ▼ | 15 | | | |
| Subst | Si ▼ | | Calculation | | |

F I G . 1 4
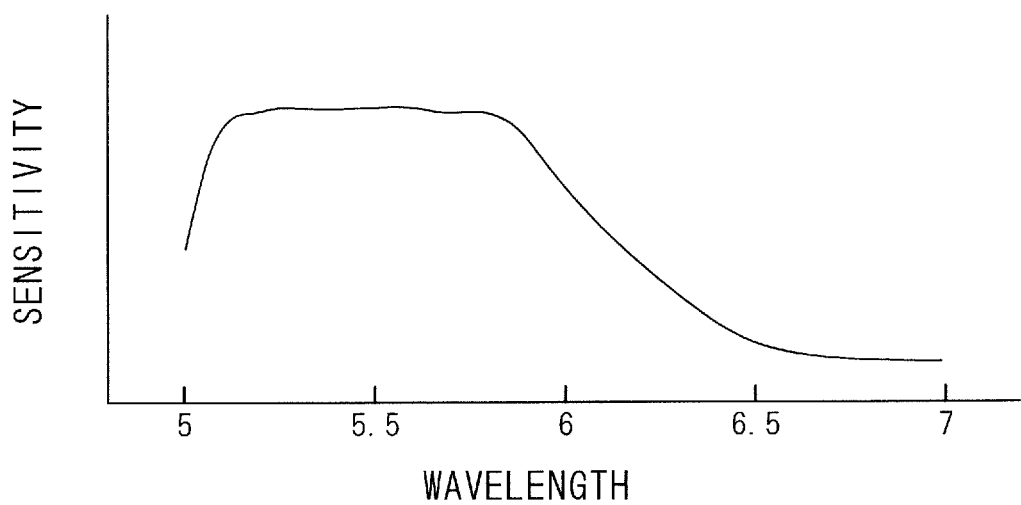

F I G. 1 5
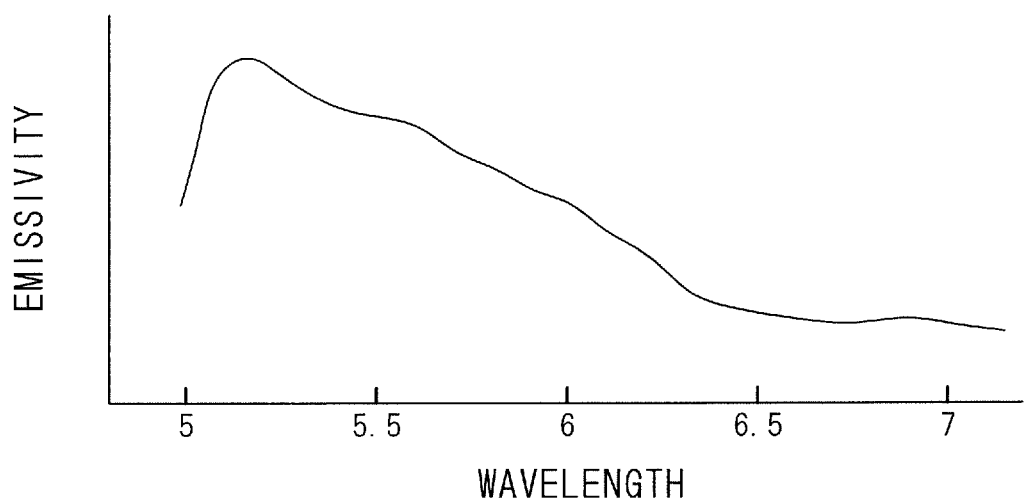

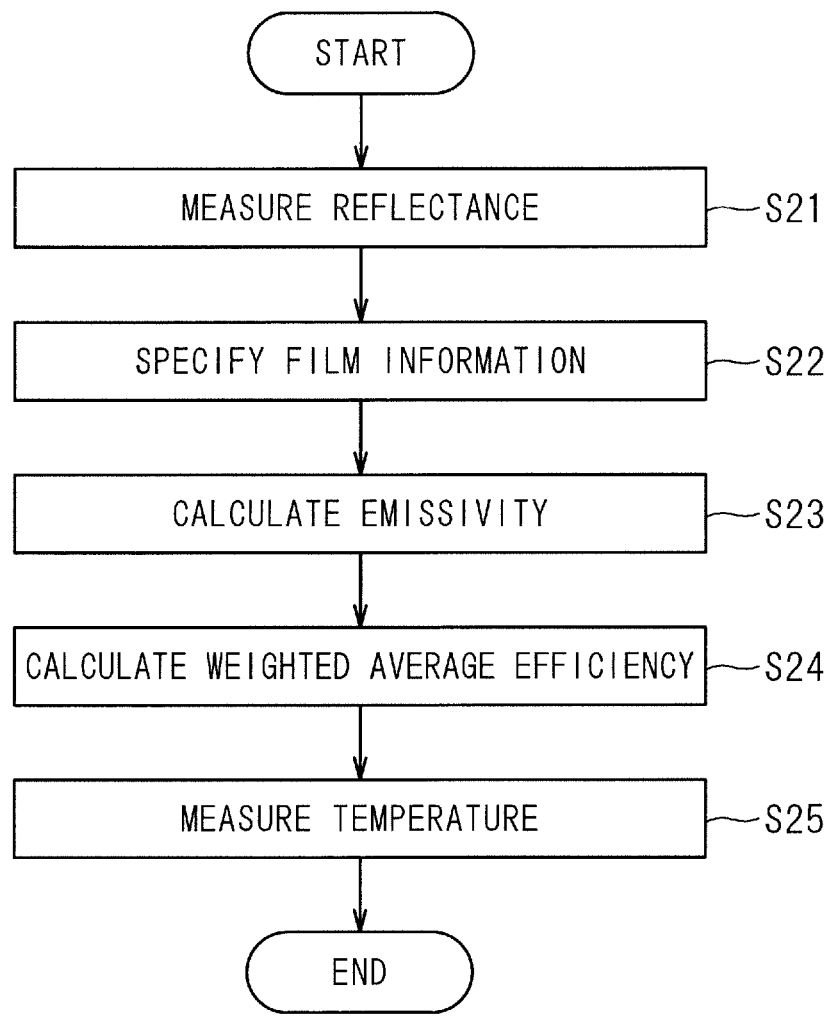

HEAT TREATMENT METHOD AND HEAT TREATMENT APPARATUS OF LIGHT IRRADIATION TYPE

BACKGROUND OF THE INVENTION

Field of the Invention

The present invention relates to a heat treatment method and a heat treatment apparatus, for irradiating a thin-plated precision electronic substrate (hereinafter referred to as simply "substrate") such as a semiconductor wafer with a flash of light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a front surface of a semiconductor wafer with a flash of light, thereby raising the temperature of only the front surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. In addition, it has turned out that flash irradiation, that is, the irradiation of a semiconductor wafer with a flash of light in an extremely short time of several milliseconds or less allows a selective temperature increase only near the front surface of the semiconductor wafer.

This kind of flash lamp annealing is used for treatment requiring heating for an extremely short time, such as typically activation of impurities implanted into a semiconductor wafer. The irradiation of a front surface of a semiconductor wafer implanted with impurities by an ion implantation process with a flash of light emitted from flash lamps allows the temperature increase only in the front surface of the semiconductor wafer to an activation temperature for an extremely short time. This enables achieving only the activation of the impurities without deep diffusion of the impurities.

Besides the flash lamp annealing, control of wafer temperature is important in heat treatment of a semiconductor wafer. Even in the flash lamp annealing, a maximum reached temperature on the front surface of a semiconductor wafer when being irradiated with a flash of light is an important process control index as to whether treatment has been correctly performed. This causes temperature of a semiconductor wafer to be typically measured by a non-contact radiation thermometer. Temperature measurement using a radiation thermometer requires emissivity of an object to be measured, and thus conventionally, temperature of a semiconductor wafer has been measured using the emissivity of silicon.

The front surface of a semiconductor wafer is formed with various kinds of thin film such as a resist film, an interlayer insulating film, or a high dielectric constant film in many cases. While a semiconductor wafer formed with such a thin film has an emissivity different from that of silicon, US 2018/0269085 discloses that decrease in measurement angle (e.g., 15° or less) of a radiation thermometer with respect to a semiconductor wafer causes an apparent emissivity of the thin film not to depend on a kind of film or a film thickness. Thus, decrease in installation angle of a radiation thermometer with respect to a semiconductor wafer enables temperature of the semiconductor wafer formed with a thin film to be measured by even using the emissivity of silicon.

However, recent semiconductor technology leads various thin films to be stacked in multiple layers (e.g., 100 layers or more) with progress of three-dimensional high density. It has been found that when thin films are stacked in multiple layers, an apparent emissivity greatly changes by even reducing a measurement angle of a radiation thermometer. This causes a problem that when a semiconductor wafer formed with a multilayer film is irradiated with a flash of light, a maximum reached temperature of the front surface thereof cannot be measured correctly. When the maximum reached temperature of the front surface of the semiconductor wafer at the time of irradiation with a flash of light cannot be accurately measured, it is unknown whether treatment has been performed correctly. As a result, a yield may be deteriorated.

SUMMARY OF THE INVENTION

The present invention is directed to a heat treatment method for irradiating a substrate with a flash of light to heat the substrate.

In an aspect of the present invention, a heat treatment method includes the following steps of: (a) calculating emissivity of a substrate as viewed from a radiation thermometer based on film information about a thin film formed on the substrate, substrate information about the substrate, and an installation angle of the radiation thermometer that measures temperature of the substrate; and (b) setting the emissivity calculated in the step (a) in the radiation thermometer to measure the temperature of the substrate heated by irradiation with a flash of light using the radiation thermometer.

This enables temperature of a substrate formed even with thin films in multiple layers to be accurately measured.

In the step (a), a weighted average efficiency of the emissivity of the substrate is preferably calculated based on a sensitivity distribution of the radiation thermometer.

This enables the temperature of the substrate to be measured more accurately.

The present invention is also directed to a heat treatment apparatus for irradiating a substrate with a flash of light to heat the substrate.

In another aspect of the present invention, a heat treatment apparatus includes: a chamber for housing a substrate to be treated; a flash lamp for irradiating the substrate housed in the chamber with a flash of light; a radiation thermometer for measuring temperature of the substrate; and an emissivity calculating part for calculating emissivity of the substrate as viewed from the radiation thermometer based on film information about a thin film formed on the substrate, substrate information about the substrate, and an installation angle of the radiation thermometer, in which the emissivity calculated by the emissivity calculating part is set in the radiation thermometer, and the temperature of the substrate heated by irradiation with a flash of light from the flash lamp is measured by the radiation thermometer.

This enables temperature of a substrate formed even with thin films in multiple layers to be accurately measured.

The emissivity calculating part preferably calculates a weighted average efficiency of the emissivity of the substrate based on a sensitivity distribution of the radiation thermometer.

This enables the temperature of the substrate to be measured more accurately.

Thus, it is an object of the present invention to measure accurately temperature of a substrate formed even with thin films in multiple layers.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a plan view of a susceptor;

FIG. 6 is a sectional view of the susceptor;

FIG. 12 is a diagram illustrating an example of an information input screen;

FIG. 14 is a graph showing a sensitivity distribution of an upper radiation thermometer;

FIG. 15 is a graph showing spectral emissivity of a semiconductor wafer after correction; and FIG. 16 is a flowchart illustrating a temperature measurement procedure according to a second preferred embodiment.

DESCRIPTION OF THE PREFERRED EMBODIMENTS

Hereinafter, preferred embodiments according to the present invention will be described in detail with reference to the drawings.

First Preferred Embodiment

Figure 1:
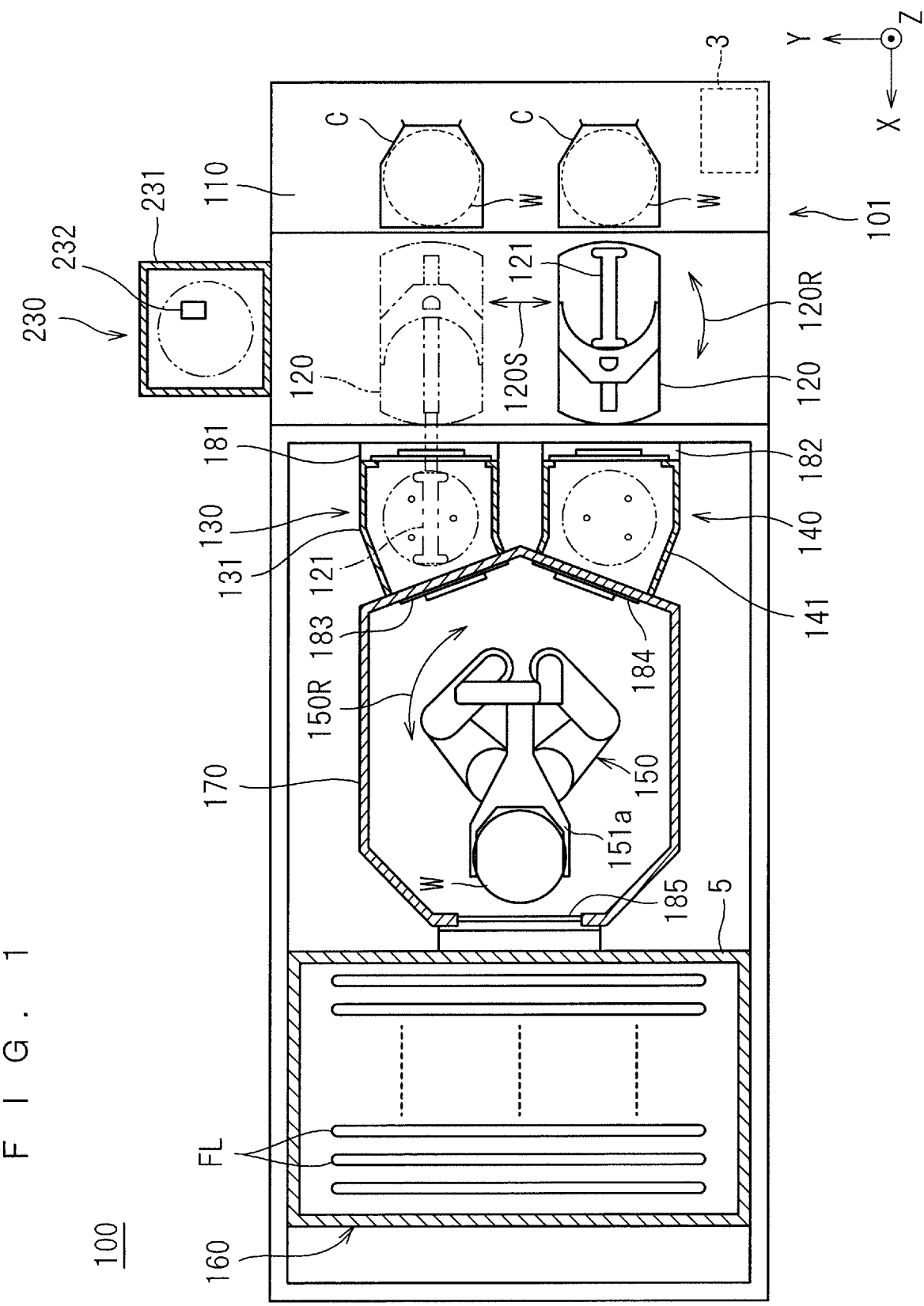
FIG. 1 is a plan view illustrating a heat treatment apparatus according to the present invention.
Figure 2:
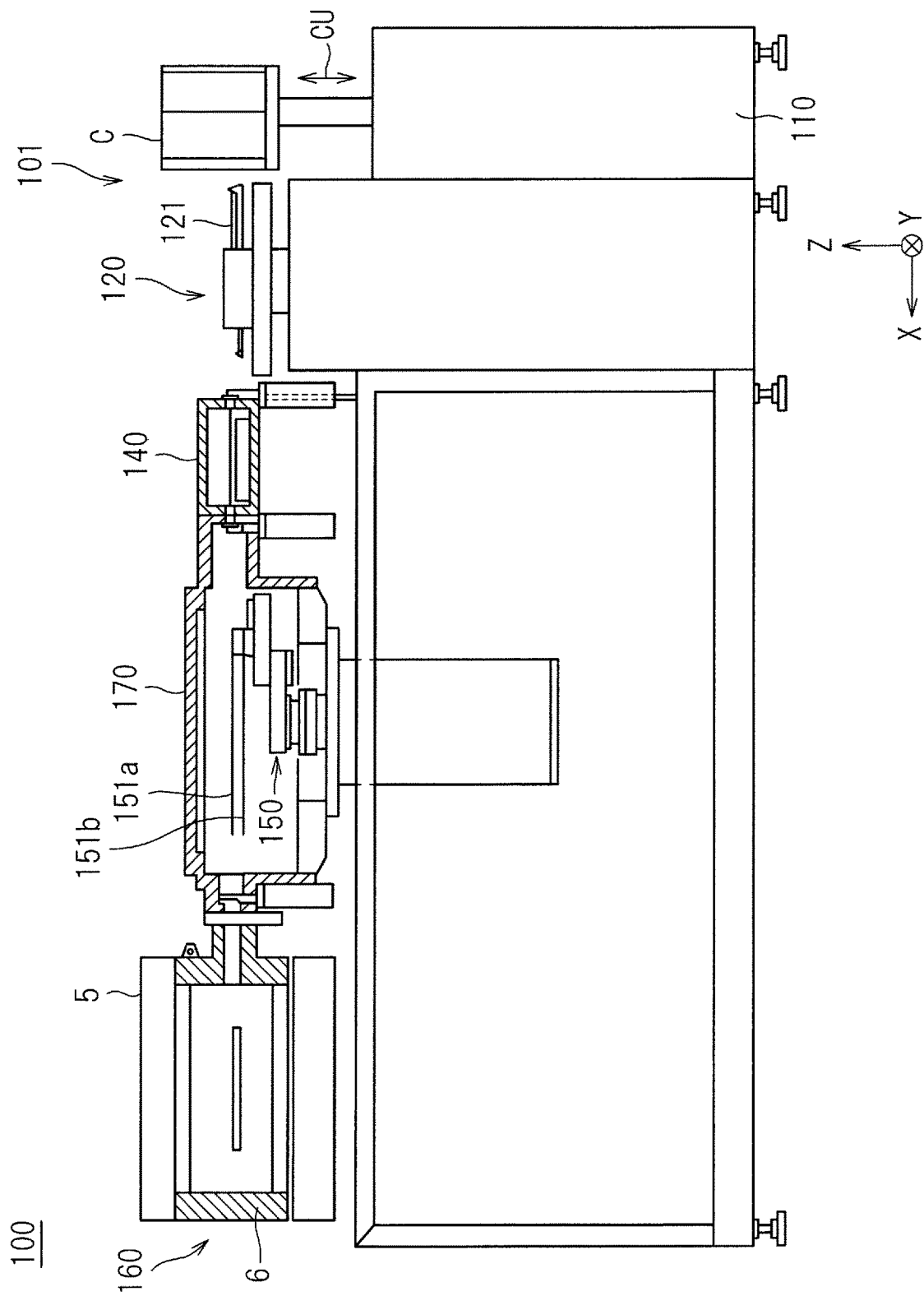
FIG. 2 is a front view of the heat treatment apparatus of FIG. 1.

First, an overall configuration of a heat treatment apparatus according to the present invention will be described. FIG. 1 is a plan view illustrating a heat treatment apparatus 100 according to the present invention, and FIG. 2 is a front view of the heat treatment apparatus 100. The heat treatment apparatus 100 is a flash lamp annealer for irradiating a disk-shaped semiconductor wafer W serving as a substrate with a flash of light to heat the semiconductor wafer W. While a size of the semiconductor wafer W to be treated is not particularly limited, the semiconductor wafer W to be treated has a diameter of 300 mm or 450 mm, for example. FIG. 1 and the subsequent drawings show dimensions of components and the number of components in an exaggerated manner or in a simplified manner as needed to facilitate understanding. In addition, an XYZ orthogonal coordinate system having a Z-axis direction as a vertical direction and an XY plane as a horizontal plane is given in each of FIGS. 1 to 3 to clarify a directional relationship among the drawings.

As shown in FIGS. 1 and 2, the heat treatment apparatus 100 includes: an indexer part 101 for transporting untreated semiconductor wafers W from the outside into the heat treatment apparatus 100 and for transporting treated semiconductor wafers W to the outside of the heat treatment apparatus 100; an alignment part 230 for positioning an untreated semiconductor wafer W; two cooling parts 130 and 140 for cooling semiconductor wafers W subjected to the heating treatment; a heat treatment part 160 for performing flash heating treatment on a semiconductor wafer W; and a transport robot 150 for transferring a semiconductor wafer W to and from the cooling parts 130 and 140 and the heat treatment part 160. The heat treatment apparatus 100 further includes a controller 3 for controlling operating mechanisms provided in the aforementioned processing parts and the transport robot 150 to cause the flash heating treatment of the semiconductor wafer W to proceed.

The indexer part 101 includes: a load port 110 for placing thereon a plurality of (in this preferred embodiment, two) carriers C side by side; and a transfer robot 120 for taking an untreated semiconductor wafer W out of each of the carriers C and for storing a treated semiconductor wafer W into each of the carriers C. The carrier C storing an untreated semiconductor wafer W is transported by an automatic guided vehicle (AGV, OHT) or the like, and is placed on the load port 110. The carrier C storing a treated semiconductor wafer W is transported out from the load port 110 by an automatic guided vehicle.

In the load port 110, the carriers C are movable upwardly and downwardly as indicated by an arrow CU in FIG. 2 so that the transfer robot 120 is able to load any semiconductor wafer W into each carrier C and unload any semiconductor wafer W from each carrier C. As a form of the carrier C, a standard mechanical inter face (SMIF) pod, and an open cassette (OC) exposing a stored semiconductor wafer W to the outside air, may be used in addition to a front opening unified pod (FOUP) that houses the semiconductor wafer W in a hermetically sealed space.

In addition, the transfer robot 120 can perform a sliding movement as indicated by an arrow 120S in FIG. 1, a turning operation as shown by an arrow 120R in FIG. 1, and a lifting operation. Thus, the transfer robot 120 loads and unloads semiconductor wafers W into and from the two carriers C, and transfers semiconductor wafers W to and from the alignment part 230 and the two cooling parts 130 and 140. The operation of the transfer robot 120 loading and unloading the semiconductor wafers W into and from the carriers C is achieved by the sliding movement of a hand 121 of the transfer robot 120 and the upward and downward movement of the carriers C. The transfer of the semiconductor wafers W between the transfer robot 120 and the alignment part 230 or between the transfer robot 120 and the cooling parts 130 and 140 is achieved by the sliding movement of the hand 121 and the upward and downward movement of the transfer robot 120.

The alignment part 230 is provided on and connected to one side of the indexer part 101 in adjacent relation thereto along the Y axis. The alignment part 230 is a processing part for rotating a semiconductor wafer W in a horizontal plane to an orientation appropriate for flash heating. The alignment part 230 includes an alignment chamber 231 that is an enclosure made of an aluminum alloy, mechanisms (a rotary support part 237 and a rotary motor 238 illustrated in FIG. 10) provided in the alignment chamber 231 and for supporting and rotating a semiconductor wafer W in a horizontal orientation, a mechanism provided in the alignment chamber 231 and for optically detecting a notch, an orientation flat, and the like formed in a peripheral portion of a semiconductor wafer W, and the like. The alignment chamber 231 is provided with a reflectance measuring part 232 for measuring the reflectance of a front surface of a semiconductor wafer W supported in the alignment chamber 231. The reflectance measuring part 232 irradiates the front surface of the semiconductor wafer W with light and receives light reflected from the front surface to measure the reflectance of the front surface of the semiconductor wafer W, based on the intensity of the reflected light.

The transfer robot 120 transfers a semiconductor wafer W to and from the alignment part 230. The semiconductor wafer W with the center thereof in a predetermined position is transferred from the transfer robot 120 to the alignment chamber 231. The alignment part 230 rotates the semiconductor wafer W received from the indexer part 101 about a vertical axis passing through the central portion of the semiconductor wafer W to optically detect a notch and the like, thereby adjusting the orientation of the semiconductor wafer W. The reflectance measuring part 232 also measures the reflectance of the front surface of the semiconductor wafer W. The semiconductor wafer W subjected to the orientation adjustment is taken out of the alignment chamber 231 by the transfer robot 120.

A transport chamber 170 for housing the transport robot 150 therein is provided as space for transport of the semiconductor wafer W by means of the transport robot 150. A treatment chamber 6 in the heat treatment part 160, a first cool chamber 131 in the cooling part 130, and a second cool chamber 141 in the cooling part 140 are connected in communication with three sides of the transport chamber 170.

The heat treatment part 160 which is a principal part of the heat treatment apparatus 100 is a substrate processing part for irradiating a preheated semiconductor wafer W with a flash of light from xenon flash lamps FL to perform flash heating treatment on the semiconductor wafer W. The configuration of the heat treatment part 160 will be described later in detail.

The two cooling parts 130 and 140 are substantially similar in configuration to each other. The cooling parts 130 and 140 include respective metal cooling plates and respective quartz plates (both not shown) placed on the upper surfaces of the cooling plates in the first and second cool chambers 131 and 141 that are enclosures made of an aluminum alloy. Each of the cooling plates is temperature-controlled at ordinary temperatures (approximately 23° C.) by a Peltier element or by circulation of constant-temperature water. The semiconductor wafer W subjected to the flash heating treatment in the heat treatment part 160 is transported into the first cool chamber 131 or the second cool chamber 141, and is then placed and cooled on a corresponding one of the quartz plate.

The first cool chamber 131 and the second cool chamber 141 provided between the indexer part 101 and the transport chamber 170 are connected to both the indexer part 101 and the transport chamber 170. Each of the first cool chamber 131 and the second cool chamber 141 has two openings for transporting the semiconductor wafer W thereinto and therefrom. One of the openings of the first cool chamber 131 which is connected to the indexer part 101 is openable by a gate valve 181. The other opening of the first cool chamber 131 which is connected to the transport chamber 170 is openable by a gate valve 183. In other words, the first cool chamber 131 and the indexer part 101 are connected to each other through the gate valve 181, and the first cool chamber 131 and the transport chamber 170 are connected to each other through the gate valve 183.

The gate valve 181 is opened when the semiconductor wafer W is transferred between the indexer part 101 and the first cool chamber 131. The gate valve 183 is opened when the semiconductor wafer W is transferred between the first cool chamber 131 and the transport chamber 170. When the gate valve 181 and the gate valve 183 are closed, the interior of the first cool chamber 131 is an enclosed space.

One of the two openings of the second cool chamber 141 which is connected to the indexer part 101 is openable by a gate valve 182. The other opening of the second cool chamber 141 which is connected to the transport chamber 170 is openable by a gate valve 184. In other words, the second cool chamber 141 and the indexer part 101 are connected to each other through the gate valve 182, and the second cool chamber 141 and the transport chamber 170 are connected to each other through the gate valve 184.

The gate valve 182 is opened when the semiconductor wafer W is transferred between the indexer part 101 and the second cool chamber 141. The gate valve 184 is opened when the semiconductor wafer W is transferred between the second cool chamber 141 and the transport chamber 170. When the gate valve 182 and the gate valve 184 are closed, the interior of the second cool chamber 141 is an enclosed space.

The cooling parts 130 and 140 further include respective gas supply mechanisms for supplying clean nitrogen gas to the first and second cool chambers 131 and 141 and respective exhaust mechanisms for exhausting atmospheres from the first and second cool chambers 131 and 141. The gas supply mechanisms and the exhaust mechanisms may be capable of changing the flow rates thereof in two levels.

The transport robot 150 provided in the transport chamber 170 can be turned as indicated by an arrow 150R about an axis along the vertical direction. The transport robot 150 includes two linkage mechanisms composed of a plurality of arm segments. Transport hands 151a and 151b each for holding a semiconductor wafer W are provided at respective distal ends of the two linkage mechanisms. These transport hands 151a and 151b are vertically spaced a predetermined distance apart from each other, and are independently linearly slidable in the same horizontal direction by the respective linkage mechanisms. The transport robot 150 moves a base provided with the two linkage mechanisms upwardly and downwardly to thereby move the two transport hands 151a and 151b spaced the predetermined distance apart from each other upwardly and downwardly.

When the transport robot 150 transfers (loads and unloads) a semiconductor wafer W to and from the first cool chamber 131, the second cool chamber 141, or the treatment chamber 6 in the heat treatment part 160 as a transfer target, both of the transport hands 151a and 151b turn into opposed relation to the transfer target, and move upwardly or downwardly after (or during) the turning movement, so that one of the transport hands 151a and 151b reaches a vertical position at which the semiconductor wafer W is to be transferred to and from the transfer target. Then, the transport robot 150 causes the transport hand 151a (or 151b) to linearly slide in a horizontal direction, thereby transferring the semiconductor wafer W to and from the transfer target.

The transfer of a semiconductor wafer W between the transport robot 150 and the transfer robot 120 is performed through the cooling parts 130 and 140. That is, the first cool chamber 131 in the cooling part 130 and the second cool chamber 141 in the cooling part 140 function also as paths for transferring a semiconductor wafer W between the transport robot 150 and the transfer robot 120. Specifically, one of the transport robot 150 and the transfer robot 120 transfers a semiconductor wafer W to the first cool chamber 131 or the second cool chamber 141, and the other of the transport robot 150 and the transfer robot 120 receives the semiconductor wafer W, whereby the transfer of the semiconductor wafer W is performed. The transport robot 150 and the transfer robot 120 constitute a transport mechanism for transporting a semiconductor wafer W from the carriers C to the heat treatment part 160.

As mentioned above, the gate valves 181 and 182 are provided between the indexer part 101 and the first and second cool chambers 131 and 141, respectively. The gate valves 183 and 184 are provided between the transport chamber 170 and the first and second cool chambers 131 and 141, respectively. A gate valve 185 is further provided between the transport chamber 170 and the treatment chamber 6 of the heat treatment part 160. These gate valves 181 to 185 are opened and closed, as appropriate, when the semiconductor wafer W is transported in the heat treatment apparatus 100. Nitrogen gas is supplied from a gas supply part to the transport chamber 170 and the alignment chamber 231, and an exhaust part exhausts atmospheres from the transport chamber 170 and the alignment chamber 231 (both not shown).

Figure 3:
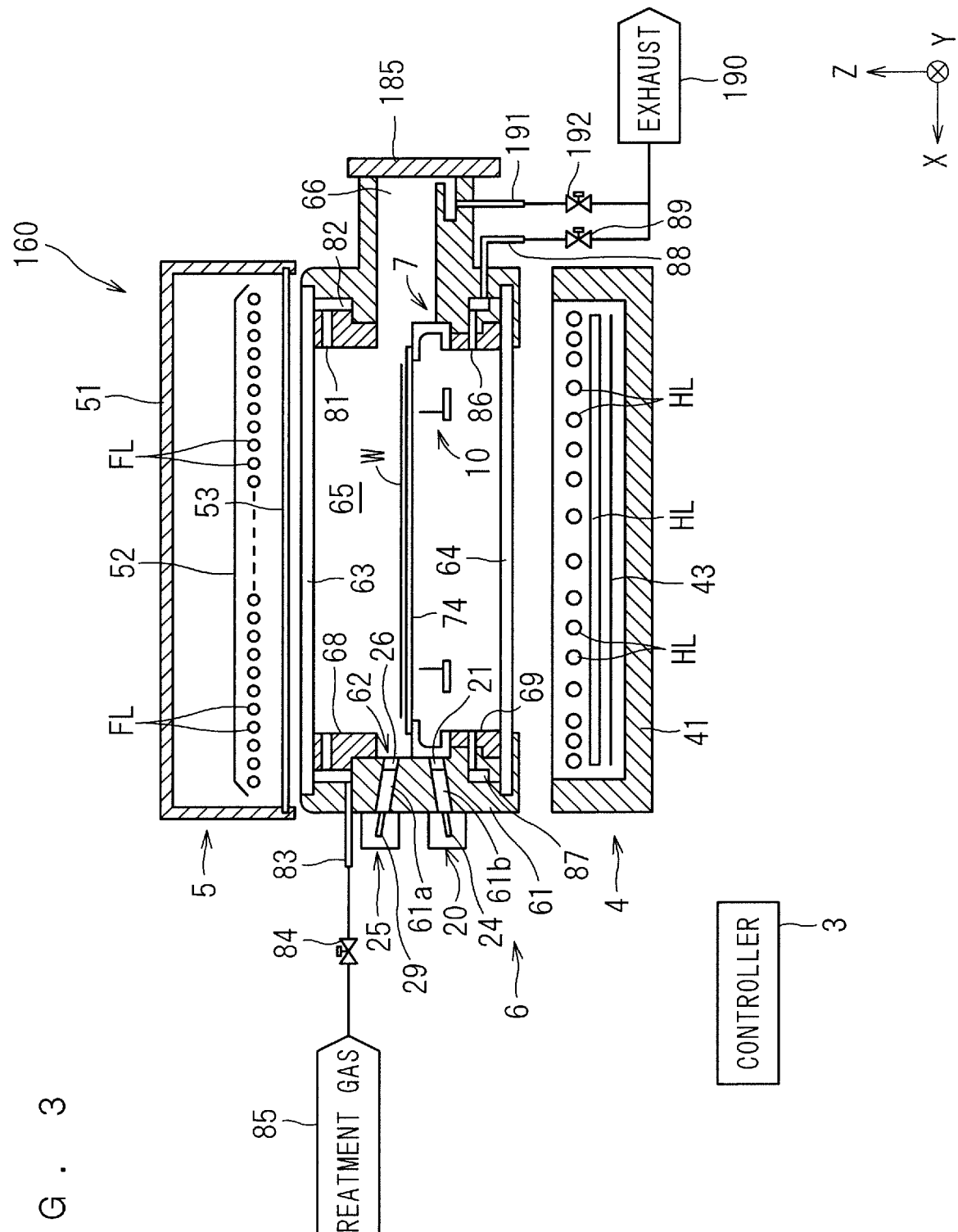
FIG. 3 is a longitudinal sectional view illustrating structure of a heat treatment part.

Next, structure of the heat treatment part 160 will be described. FIG. 3 is a longitudinal sectional view illustrating structure of the heat treatment part 160. The heat treatment part 160 includes the treatment chamber 6 for receiving a semiconductor wafer W therein to perform heating treatment on the semiconductor wafer W, a flash lamp house 5 including the plurality of built-in flash lamps FL, and a halogen lamp house 4 including a plurality of built-in halogen lamps HL. The flash lamp house 5 is provided over the treatment chamber 6, and the halogen lamp house 4 is provided under the treatment chamber 6. The heat treatment part 160 further includes a holder 7 provided inside the treatment chamber 6 and for holding a semiconductor wafer W in a horizontal orientation, and a transfer mechanism 10 provided inside the treatment chamber 6 and for transferring a semiconductor wafer W between the holder 7 and the transport robot 150.

The treatment chamber 6 includes a tubular chamber side portion 61, and chamber windows made of quartz mounted on the top and bottom of the chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the treatment chamber 6 is a disk-shaped member made of quartz, and serves as a quartz window that transmits a flash of light emitted from the flash lamps FL therethrough into the treatment chamber 6. The lower chamber window 64 forming the floor of the treatment chamber 6 is also a disk-shaped member made of quartz, and serves as a quartz window that transmits light emitted from the halogen lamps HL therethrough into the treatment chamber 6.

An upper reflective ring 68 is mounted to an upper portion of the inner wall surface of the chamber side portion 61, and a lower reflective ring 69 is mounted to a lower portion thereof. The upper and lower reflective rings 68 and 69 are each formed in the shape of an annular ring. The upper reflective ring 68 is mounted by being inserted downwardly from above the chamber side portion 61. The lower reflective ring 69, on the other hand, is mounted by being inserted upwardly from below the chamber side portion 61 and fastened with screws (not illustrated). In other words, the upper and lower reflective rings 68 and 69 are removably mounted to the chamber side portion 61. An interior space of the treatment chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the treatment chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the treatment chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the treatment chamber 6. The transport opening 66 is openable and closable by the gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the treatment chamber 6 is an enclosed space.

The chamber side portion 61 is further provided with through holes 61a and 61b bored therein. The through hole 61a is a cylindrical hole for guiding infrared light to an infrared sensor 29 of an upper radiation thermometer 25, the infrared light being emitted from an upper surface of a semiconductor wafer W held by a susceptor 74 described later. On the other hand, the through hole 61b is a cylindrical hole for guiding infrared light emitted from a lower surface of a semiconductor wafer W to an infrared sensor 24 of a lower radiation thermometer 20. The through holes 61a and 61b are each provided inclined from a horizontal direction, and each has an axis in its penetrating direction intersecting a main surface of a semiconductor wafer W held by the susceptor 74. The through hole 61a is provided at its end facing the heat treatment space 65 with a transparent window 26 made of a calcium fluoride material that allows infrared light in a wavelength range measurable by the upper radiation thermometer 25 to pass therethrough. In addition, the through hole 61b is provided at its end facing the heat treatment space 65 with a transparent window 21 made of a barium fluoride material that allows infrared light in a wavelength range measurable by the lower radiation thermometer 20 to pass therethrough.

At least one gas supply opening 81 for supplying a treatment gas therethrough into the heat treatment space 65 is provided in an upper portion of the inner wall of the treatment chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the treatment chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), and reactive gases such as hydrogen ($H_2$) and ammonia ($NH_3$) (although nitrogen is used in the present preferred embodiment).

At least one gas exhaust opening 86 for exhausting a gas from the heat treatment space 65 is provided in a lower portion of the inner wall of the treatment chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the treatment chamber 6. The gas exhaust pipe 88 is connected to an exhaust mechanism 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The pluralities of gas supply opening 81 and gas exhaust opening 86 may be provided in a circumferential direction of the treatment chamber 6, and each may be in the shape of slit. The treatment gas supply source 85 and the exhaust mechanism 190 may be mechanisms provided in the heat treatment apparatus 100 or be utility systems in a factory in which the heat treatment apparatus 100 is installed.

A gas exhaust pipe 191 for exhausting the gas from the heat treatment space 65 is also connected to a distal end of the transport opening 66. The gas exhaust pipe 191 is connected through a valve 192 to the exhaust mechanism 190. When the valve 192 is opened, the gas in the treatment chamber 6 is exhausted through the transport opening 66.

Figure 4:
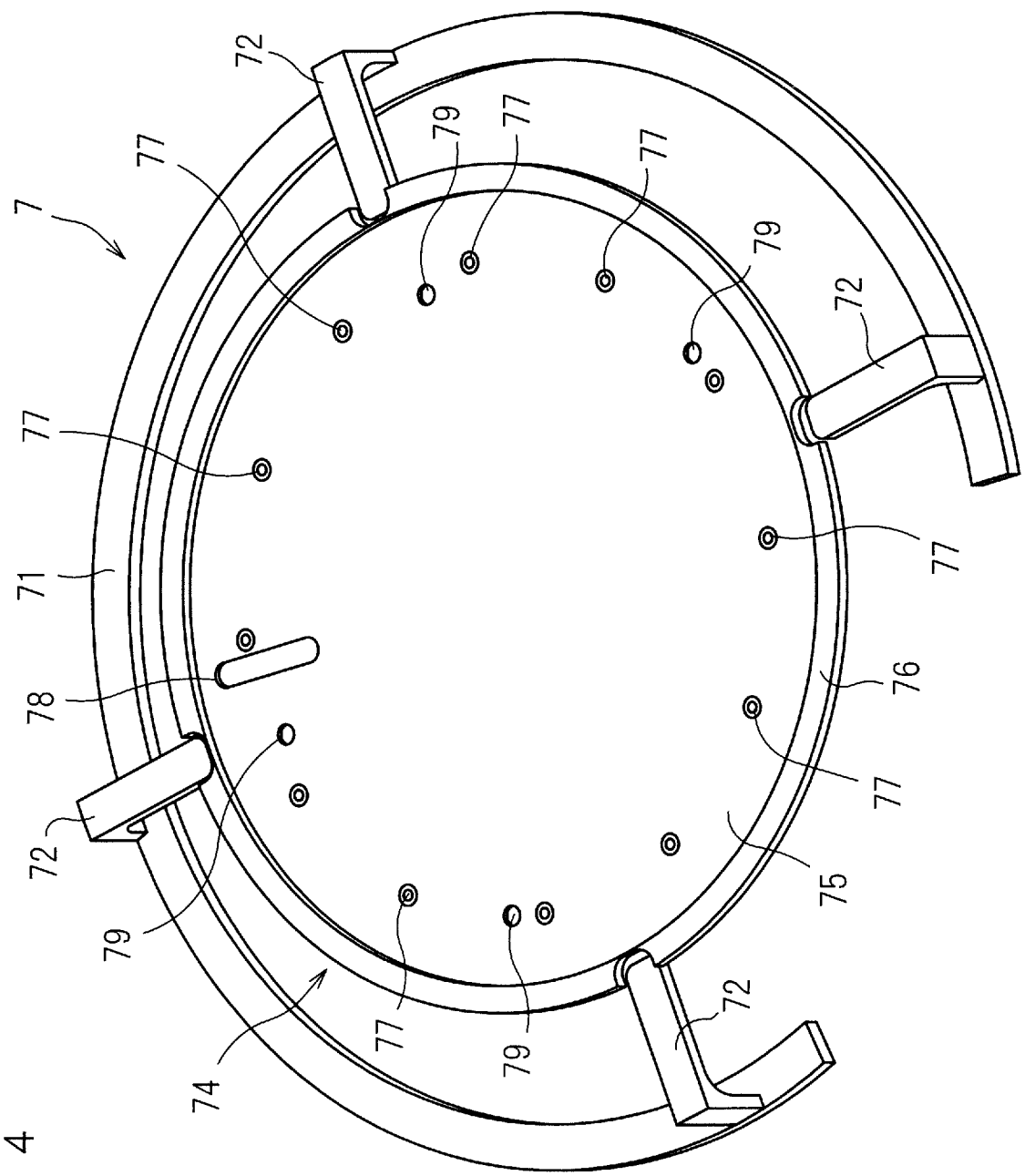
FIG. 4 is a perspective view illustrating an overall appearance of a holder.

FIG. 4 is a perspective view illustrating the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the treatment chamber 6 by being placed on the bottom surface of the recessed portion 62 (refer to FIG. 3). The multiple coupling portions 72 (in the present preferred embodiment, four coupling portions 72) are mounted upright on the upper surface of the base ring 71 and arranged in a circumferential direction of the annular shape thereof. The coupling portions 72 are each a quartz member, and are each rigidly secured to the base ring 71 by welding.

The susceptor 74 is supported by the four coupling portions 72 provided on the base ring 71. FIG. 5 is a plan view of the susceptor 74. FIG. 6 is a sectional view of the susceptor 74. The susceptor 74 includes a holding plate 75, a guide ring 76, and a plurality of substrate support pins 77. The holding plate 75 is a substantially circular planar member made of quartz. The holding plate 75 has a diameter greater than that of a semiconductor wafer W. In other words, the holding plate 75 has a planar size greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the semiconductor wafer W has a diameter of 300 mm, the guide ring 76 has an inner diameter of 320 mm. The guide ring 76 has an inner periphery formed in a tapered surface increasing in diameter upward from the holding plate 75. The guide ring 76 is made of quartz similar to that of the holding plate 75. The guide ring 76 may be welded to the upper surface of the holding plate 75, or fixed to the holding plate 75 with pins separately machined or the like. Alternatively, the holding plate 75 and the guide ring 76 may be machined as an integral member.

The upper surface of the holding plate 75 includes a region inside the guide ring 76, serving as a planar holding surface 75a for holding the semiconductor wafer W. The plurality of substrate support pins 77 are provided upright on the holding surface 75a of the holding plate 75. In the present preferred embodiment, a total of 12 substrate support pins 77 are provided upright every 30 degrees along the circumference of a circle concentric with the outer circumference of the holding surface 75a (the inner circumference of the guide ring 76). The 12 substrate support pins 77 are disposed on a circle that has a diameter (a distance between the substrate support pins 77 facing each other) smaller than a diameter of the semiconductor wafer W, and that has a diameter of 270 mm to 280 mm (270 mm in the present preferred embodiment) when the semiconductor wafer W has a diameter of 300 mm. Each of the substrate support pins 77 is made of quartz. The substrate support pins 77 may be provided by welding on the upper surface of the holding plate 75 or machined integrally with the holding plate 75.

Referring again to FIG. 4, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. When the base ring 71 of the holder 7, as described above, is supported by the wall surface of the treatment chamber 6, the holder 7 is mounted to the treatment chamber 6. The holder 7 mounted to the treatment chamber 6 causes the holding plate 75 of the susceptor 74 to be a horizontal orientation (an orientation in which the normal line to the holding plate 75 coincides with a vertical direction). In other words, the holding surface 75a of the holding plate 75 becomes a horizontal surface.

A semiconductor wafer W transported into the treatment chamber 6 is placed and held in a horizontal orientation on the susceptor 74 of the holder 7 mounted to the treatment chamber 6. At this time, the semiconductor wafer W is supported by the 12 substrate support pins 77 provided upright on the holding plate 75, and is held by the susceptor 74. More specifically, the 12 substrate support pins 77 have respective upper end portions that come into contact with the lower surface of the semiconductor wafer W to support the semiconductor wafer W. The 12 substrate support pins 77 are uniform in height (distance from an upper end of each of the substrate support pins 77 to the holding surface 75a of the holding plate 75), so that the semiconductor wafer W can be supported in a horizontal orientation by the 12 substrate support pins 77.

The semiconductor wafer W is supported by the plurality of substrate support pins 77 at a predetermined interval from the holding surface 75a of the holding plate 75. The guide ring 76 has a thickness greater than a height of each of the substrate support pins 77. Thus, the guide ring 76 prevents the horizontal misregistration of the semiconductor wafer W supported by the substrate support pins 77.

As illustrated in FIGS. 4 and 5, the holding plate 75 of the susceptor 74 is formed with an opening 78 extending vertically through the holding plate 75. The opening 78 is provided for a lower radiation thermometer 20 (refer to FIG. 3) to receive radiation (infrared light) emitted from the lower surface of the semiconductor wafer W. Specifically, the lower radiation thermometer 20 receives light emitted from the lower surface of the semiconductor wafer W through the opening 78 and the transparent window 21 mounted to the through hole 61b in the chamber side portion 61 to measure temperature of the semiconductor wafer W. The holding plate 75 of the susceptor 74 further includes four through holes 79 bored therein through which respective lift pins 12 of the transfer mechanism 10, described later, pass to transfer a semiconductor wafer W.

Figure 7:
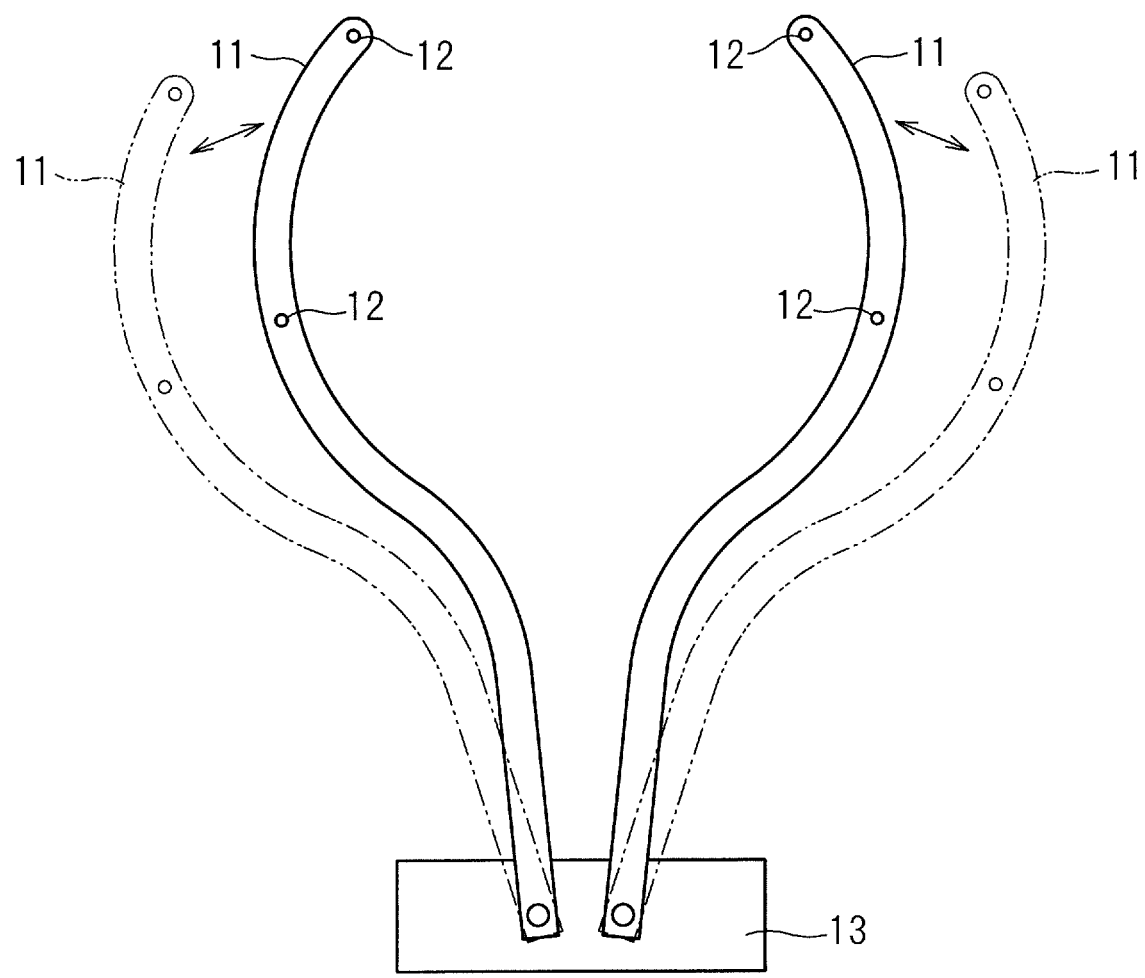
FIG. 7 is a plan view of a transfer mechanism.
Figure 8:
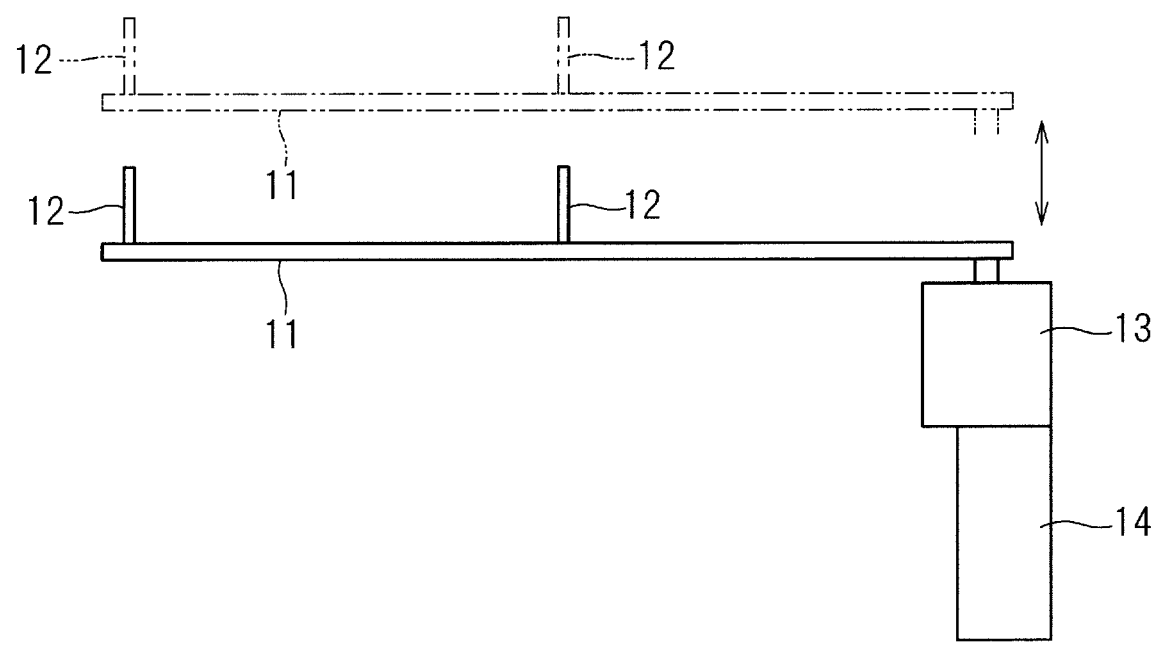
FIG. 8 is a side view of the transfer mechanism.

FIG. 7 is a plan view of the transfer mechanism 10. FIG. 8 is a side view of the transfer mechanism 10. The transfer mechanism 10 includes the two transfer arms 11. The transfer arms 11 are each in an arcuate shape substantially along the recessed portion 62 in an annular shape. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 7) in which a semiconductor wafer W is transferred to and from the holder 7 and a retracted position (a position indicated by dash-double-dot lines in FIG. 7) in which the transfer arms 11 do not overlap the semiconductor wafer W held by the holder 7 as seen in plan view. The transfer operation position is under the susceptor 74, and the retracted position is outside the susceptor 74. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. When the elevating mechanism 14 moves up the pair of transfer arms 11 at their transfer operation positions, the four lift pins 12 in total pass through the respective four through holes 79 (refer to FIGS. 4 and 5) bored in the susceptor 74. This allows upper ends of the lift pins 12 to protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted positions of the pair of transfer arms 11 are immediately over the base ring 71 of the holder 7. The retracted position of the transfer arms 11 is inside the recessed portion 62 because the base ring 71 is placed on the bottom surface of the recessed portion 62. The transfer mechanism 10 includes an exhaust mechanism (not illustrated) that is provided also near portions where drivers (the horizontal movement mechanism 13 and the elevating mechanism 14) are provided so that an atmosphere around the drivers of the transfer mechanism 10 is exhausted to the outside of the treatment chamber 6.

Referring again to FIG. 3, the flash lamp house 5 provided over the treatment chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash lamp house 5 further includes a lamp light radiation window 53 mounted to the bottom of the enclosure 51 of the flash lamp house 5. The lamp light radiation window 53 forming the floor of the flash lamp house 5 is a plate-like quartz window made of quartz. The flash lamp house 5 is provided over the treatment chamber 6, whereby the lamp light radiation window 53 is opposed to the upper chamber window 63. The flash lamps FL emit a flash of light from over the treatment chamber 6 through the lamp light radiation window 53 and the upper chamber window 63 into the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. The xenon gas is electrically insulative, so that no current flows in the glass tube in a normal state even when electrical charge is accumulated in the capacitor. However, when a high voltage is applied to the trigger electrode to produce a dielectric breakdown, electricity accumulated in the capacitor flows momentarily in the glass tube, and xenon atoms or molecules are excited at this time to cause light emission. Such a xenon flash lamp FL has the property of being capable of emitting extremely intense light as compared with a light source for continuous lighting such as a halogen lamp HL because the electrostatic energy preliminarily accumulated in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source that supplies power to the flash lamps FL.

The reflector 52 is provided over the plurality of flash lamps FL, covering all of the flash lamps FL. The reflector 52 has a fundamental function of reflecting a flash of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen lamp house 4 provided under the treatment chamber 6 includes an enclosure 41 incorporating the multiple (in the present preferred embodiment, 40) halogen lamps HL. The halogen lamps HL direct light from under the treatment chamber 6 through the lower chamber window 64 toward the heat treatment space 65.

Figure 9:
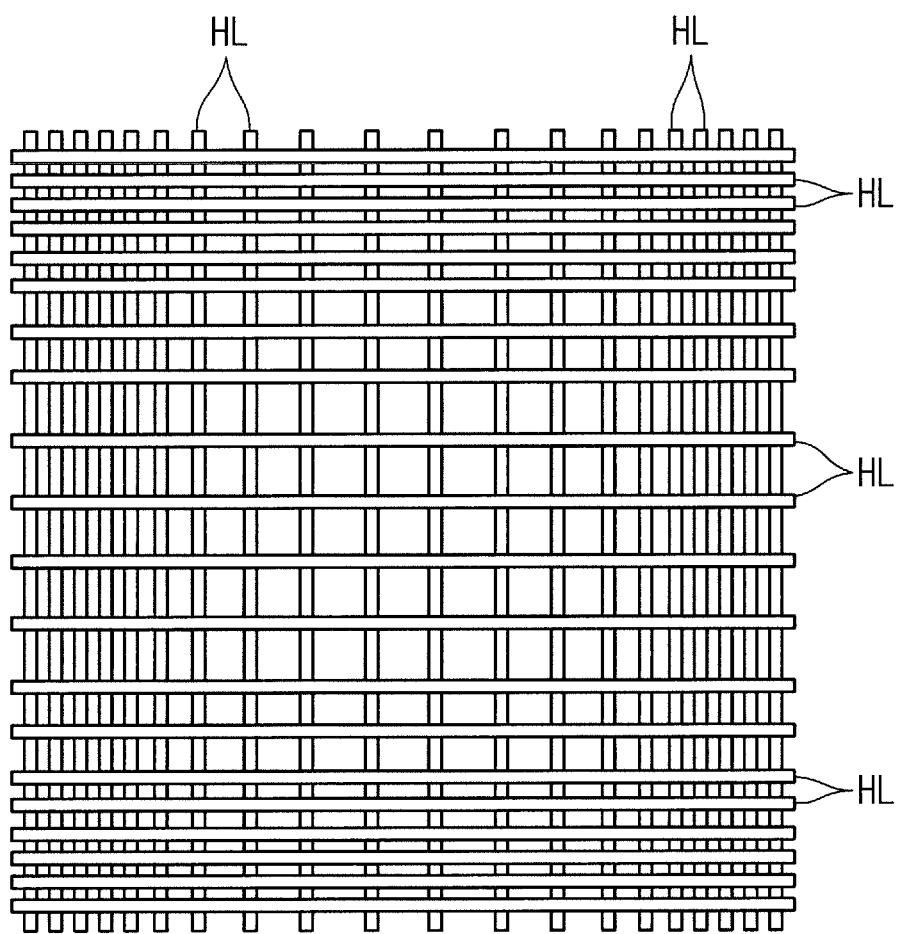
FIG. 9 is a plan view illustrating an arrangement of multiple halogen lamps.

FIG. 9 is a plan view illustrating an arrangement of the multiple halogen lamps HL. In the present preferred embodiment, 20 halogen lamps HL are arranged in each of two tiers, i.e., upper and lower tiers. Each of the halogen lamps HL is a rod-shaped lamp having an elongated cylindrical shape. The 20 halogen lamps HL in each of the upper and lower tiers are arranged so that the longitudinal directions thereof are parallel to each other along a main surface of a semiconductor wafer W held by the holder 7 (i.e., in a horizontal direction). Thus, a plane defined by the arrangement of the halogen lamps HL in each of the upper and lower tiers is also a horizontal plane.

As illustrated in FIG. 9, the halogen lamps HL in each of the upper and lower tiers are disposed at a higher density in a region facing a peripheral portion of the semiconductor wafer W held by the holder 7 than in a region facing a central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation with light from the halogen lamps HL.

The group of halogen lamps HL in the upper tier and the group of halogen lamps HL in the lower tier are arranged to intersect each other in a lattice pattern. In other words, the 40 halogen lamps HL in total are disposed so that the longitudinal direction of each of the halogen lamps HL arranged in the upper tier and the longitudinal direction of each of the halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least one second or more. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen lamp house 4 under the halogen lamps HL arranged in two tiers (FIG. 3). The reflector 43 reflects the light emitted from the halogen lamps HL toward the heat treatment space 65.

As illustrated in FIG. 3, the treatment chamber 6 is provided with two radiation thermometers (pyrometers in the present preferred embodiment) of the upper radiation thermometer 25 and the lower radiation thermometer 20. The upper radiation thermometer 25 is provided obliquely above the semiconductor wafer W held by the susceptor 74, and the lower radiation thermometer 20 is provided obliquely below the semiconductor wafer W held by the susceptor 74. The infrared sensor 29 of the upper radiation thermometer 25 has an optical axis that forms a small angle of 10°, for example, with the main surface of the semiconductor wafer W. Similarly, the infrared sensor 24 of the lower radiation thermometer 20 has an optical axis that also forms an angle of 10°, for example, with the main surface of the semiconductor wafer W. The upper radiation thermometer 25 receives infrared light emitted from the upper surface of the semiconductor wafer W and measures temperature of the upper surface from intensity of the infrared light. The infrared sensor 29 of the upper radiation thermometer 25 includes an optical element of indium antimony (InSb) to be able to respond to a rapid temperature change on the upper surface of the semiconductor wafer W at the moment when the upper surface is irradiated with a flash of light. On the other hand, the lower radiation thermometer 20 receives infrared light emitted from the lower surface of the semiconductor wafer W, and measures temperature of the lower surface from intensity of the infrared light.

Besides the aforementioned components, the heat treatment part 160 further includes various cooling structures to prevent an excessive temperature increase in the halogen lamp house 4, the flash lamp house 5, and the treatment chamber 6 due to heat energy generated by the halogen lamps HL and the flash lamps FL during heat treatment of a semiconductor wafer W. As an example, a water cooling tube (not illustrated) is provided in the walls of the treatment chamber 6. In addition, the halogen lamp house 4 and the flash lamp house 5 each have an air cooling structure for forming a gas flow therein to exhaust heat. Air is supplied to a gap between the upper chamber window 63 and the lamp light radiation window 53 to cool down the flash lamp house 5 and the upper chamber window 63.

Figure 10:
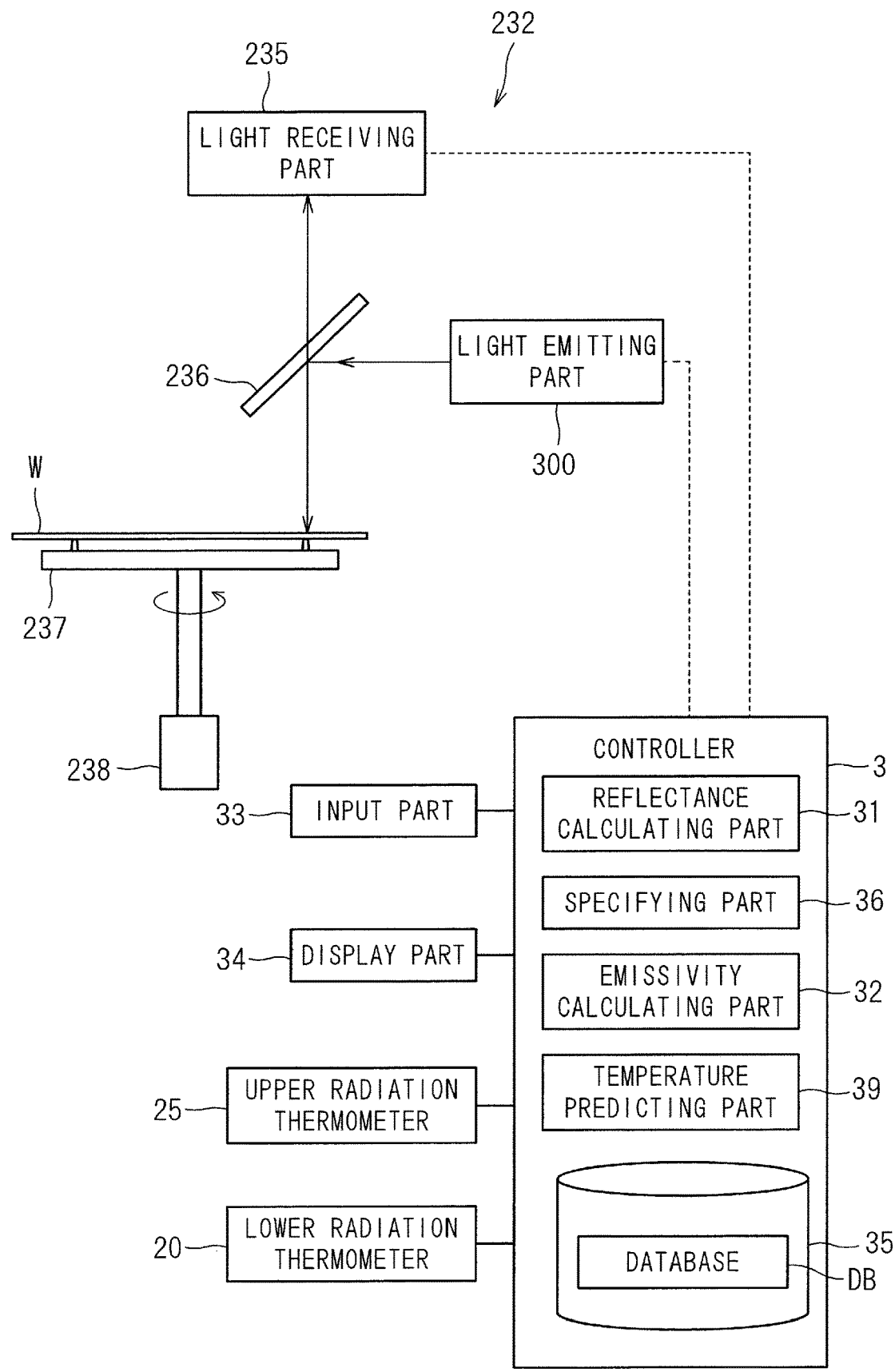
FIG. 10 is a diagram illustrating a configuration of a reflectance measuring part and a controller.

FIG. 10 is a diagram illustrating a configuration of the reflectance measuring part 232 provided in the alignment part 230 and the controller 3. The reflectance measuring part 232 includes a light emitting part 300, a light receiving part 235, and a half mirror 236. The rotary support part 237 for supporting and rotating a semiconductor wafer W and the rotary motor 238 for rotatably driving the rotary support part 237 are provided in the alignment chamber 231 of the alignment part 230. Rotating the rotary support part 237 supporting the semiconductor wafer W using the rotary motor 238 adjusts orientation of the semiconductor wafer W.

The light emitting part 300 includes a light source such as a xenon light source, a halogen light source or an LED light source, and emits light for reflectance measurement. The light receiving part 235 includes a light receiving element for converting intensity of received light into an electric signal. Light emitted from the light emitting part 300 is reflected by the half mirror 236, and is applied perpendicularly to the upper surface of the semiconductor wafer W supported by the rotary support part 237. The light emitted from the light emitting part 300 is reflected from the upper surface of the semiconductor wafer W. The reflected light passes through the half mirror 236, and is received by the light receiving part 235. The controller 3 calculates reflectance of the upper surface of the semiconductor wafer W, based on intensity of the reflected light received by the light receiving part 235. The light emitting part 300 preferably includes a plurality of light sources different in wavelength range of light to be emitted. When the light emitting part 300 includes a plurality of light sources different in wavelength range, the reflectance of the semiconductor wafer W can be measured over a wide wavelength range. The light emitting part 300 may be configured to emit light to a plurality of locations on the upper surface of the semiconductor wafer W. When a plurality of locations on the upper surface of the semiconductor wafer W is irradiated with light, local pattern dependence can be reduced.

The controller 3 controls the aforementioned various operating mechanisms provided in the heat treatment apparatus 100. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk 35 for storing control software, data and the like thereon. When the CPU in the controller 3 executes a predetermined processing program, treatment in the heat treatment apparatus 100 proceeds. The CPU of the controller 3 executes the predetermined processing program to implement functional processing parts such as a reflectance calculating part 31, a specifying part 36, an emissivity calculating part 32, and a temperature predicting part 39. Processing contents of the reflectance calculating part 31, the specifying part 36, the emissivity calculating part 32, and the temperature predicting part 39 will be further described later. While the controller 3 is provided in the indexer part 101 in FIG. 1, the controller 3 is not limited thereto, and the controller 3 can be disposed at any position in the heat treatment apparatus 100.

The controller 3 is connected to a display part 34 and an input part 33. The controller 3 causes the display part 34 to display various kinds of information. An operator of the heat treatment apparatus 100 may input various commands and parameters from the input part 33 while checking the information displayed on the display part 34. As the input part 33, a keyboard and a mouse, for example, may be used. As the display part 34, a liquid crystal display, for example, may be used. In the present preferred embodiment, a liquid crystal touch panel provided on an outer wall of the heat treatment apparatus 100 is used to function as both the display part 34 and the input part 33.

Next, a treatment operation in the heat treatment apparatus 100 according to the present invention will be described. Here, a typical treatment operation for an ordinary semiconductor wafer (product wafer) W that becomes a product will be described. The semiconductor wafer W to be treated is a semiconductor substrate into which impurities (ions) are added by an ion implantation method. The impurities are activated by the heat treatment apparatus 100 performing the process of heating (annealing) the semiconductor wafer W by irradiation with a flash of light.

First, an untreated semiconductor wafer W into which impurities are implanted is placed on the load port 110 of the indexer part 101 in a state where a plurality of semiconductor wafers W is housed in the carrier C. Then, the transfer robot 120 takes out an untreated semiconductor wafer W one by one from the carrier C, and transfers it into the alignment chamber 231 of the alignment part 230. In the alignment chamber 231, a semiconductor wafer W supported by the rotary support part 237 is rotated in a horizontal plane about a vertical axis passing through the central portion of the semiconductor wafer W, and a notch or the like is optically detected to adjust an orientation of the semiconductor wafer W.

Next, the transfer robot 120 of the indexer part 101 takes the orientation-adjusted semiconductor wafer W out of the alignment chamber 231 to transport the semiconductor wafer W into the first cool chamber 131 of the cooling part 130 or the second cool chamber 141 of the cooling part 140. The untreated semiconductor wafer W transported into the first cool chamber 131 or the second cool chamber 141 is transported to the transport chamber 170 by the transport robot 150. The first cool chamber 131 and the second cool chamber 141 function as the paths for transferring the semiconductor wafer W when the untreated semiconductor wafer W is transferred from the indexer part 101 via the first cool chamber 131 or the second cool chamber 141 to the transport chamber 170.

After taking out the semiconductor wafer W, the transport robot 150 turns so as to face the heat treatment part 160. Subsequently, the gate valve 185 opens the space between the treatment chamber 6 and the transport chamber 170, and the transport robot 150 transports the untreated semiconductor wafer W into the treatment chamber 6. At this time, when a preceding semiconductor wafer W subjected to the heating treatment is present in the treatment chamber 6, the untreated semiconductor wafer W is transported into the treatment chamber 6 after one of the transport hands 151$a$ and 151$b$ takes out the semiconductor wafer W subjected to the heating treatment. In this manner, the semiconductor wafers W are interchanged. Thereafter, the gate valve 185 closes the space between the treatment chamber 6 and the transport chamber 170.

The semiconductor wafer W transported into the treatment chamber 6 is preheated by the halogen lamps HL, and is thereafter subjected to the flash heating treatment by irradiation with a flash of light from the flash lamps FL. This flash heating treatment activates the impurities implanted in the semiconductor wafer W.

After the completion of the flash heating treatment, the gate valve 185 opens the space between the treatment chamber 6 and the transport chamber 170 again, and the transport robot 150 transports the semiconductor wafer W subjected to the flash heating treatment from the treatment chamber 6 to the transport chamber 170. After taking out the semiconductor wafer W, the transport robot 150 turns from the treatment chamber 6 so as to face the first cool chamber 131 or the second cool chamber 141. The gate valve 185 closes the space between the treatment chamber 6 and the transport chamber 170.

Thereafter, the transport robot 150 transports the semiconductor wafer W subjected to the heating treatment into the first cool chamber 131 of the cooling part 130 or the second cool chamber 141 of the cooling part 140. At this time, the semiconductor wafer W that has passed through the first cool chamber 131 before the heating treatment is also transported into the first cool chamber 131 after the heating treatment, and the semiconductor wafer W that has passed through the second cool chamber 141 before the heating treatment is also transported into the second cool chamber 141 after the heating treatment. In the first cool chamber 131 or the second cool chamber 141, the semiconductor wafer W subjected to the flash heating treatment is cooled. The semiconductor wafer W is cooled to close to ordinary temperatures in the first cool chamber 131 or the second cool chamber 141 because the temperature of the entire semiconductor wafer W is relatively high when the semiconductor wafer W is transported out of the treatment chamber 6 of the heat treatment part 160.

After a predetermined cooling treatment time elapses, the transfer robot 120 transports out a cooled semiconductor wafer W from the first cool chamber 131 or the second cool chamber 141, and returns it to the carrier C. After a predetermined number of treated semiconductor wafers W are housed in the carrier C, the carrier C is transported from the load port 110 of the indexer part 101 to the outside.

The description on the heating treatment in the heat treatment part 160 will be continued. Prior to the transport of the semiconductor wafer W into the treatment chamber 6, the valve 84 for supply of gas is opened, and the valves 89 and 192 for exhaust of gas are opened, so that the supply and exhaust of gas into and out of the treatment chamber 6 start. When the valve 84 is opened, nitrogen gas is supplied through the gas supply opening 81 into the heat treatment space 65. When the valve 89 is opened, the gas within the treatment chamber 6 is exhausted through the gas exhaust opening 86. This causes the nitrogen gas supplied from an upper portion of the heat treatment space 65 in the treatment chamber 6 to flow downwardly and then to be exhausted from a lower portion of the heat treatment space 65.

The gas within the treatment chamber 6 is exhausted also through the transport opening 66 by opening the valve 192. Further, the exhaust mechanism not shown exhausts an atmosphere near the drivers of the transfer mechanism 10. When heat treatment is applied to the semiconductor wafer W in the heat treatment part 160, nitrogen gas is continuously supplied into the heat treatment space 65. The amount of the supply is appropriately changed depending on a treatment step.

Subsequently, the gate valve 185 is opened to open the transport opening 66. The transport robot 150 transports a semiconductor wafer W to be treated through the transport opening 66 into the heat treatment space 65 of the treatment chamber 6. The transport robot 150 moves the transport hand 151a (or the transport hand 151b) holding the untreated semiconductor wafer W forward to a position lying immediately over the holder 7, and stops the transport hand 151a (or the transport hand 151b) thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the untreated semiconductor wafer W is placed on the lift pins 12, the transport robot 150 causes the transport hand 151a to move out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an orientation that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held from below in a horizontal orientation by the susceptor 74 of the holder 7, the 40 halogen lamps HL turn on simultaneously to start preheating (or assist-heating). Halogen light emitted from the halogen lamps HL passes through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. Then, the transfer arms 11 of the transfer mechanism 10 are retracted to the inside of the recessed portion 62, and thus do not obstruct the heating using the halogen lamps HL.

The lower radiation thermometer 20 measures temperature of the semiconductor wafer W when the halogen lamps HL perform the preheating. Specifically, the lower radiation thermometer 20 receives infrared light that is emitted from the lower surface of the semiconductor wafer W held by the susceptor 74 through the opening 78 and that passes through the transparent window 21 to measure the temperature of the semiconductor wafer W increasing in temperature. The measured temperature of the semiconductor wafer W is transmitted to the controller 3. The controller 3 controls output from the halogen lamps HL while monitoring whether temperature of the semiconductor wafer W, which increases in temperature with light emitted from the halogen lamps HL, reaches a predetermined preheating temperature T1. In other words, the controller 3 effects feedback control of the output from the halogen lamps HL so that the temperature of the semiconductor wafer W becomes the preheating temperature T1, based on the value measured with the lower radiation thermometer 20. As described above, the lower radiation thermometer 20 is also a temperature sensor for controlling the output of the halogen lamps HL in a preheating stage. The preheating temperature T1 is set to about 600° C. to 800° C. (700° C. in the present preferred embodiment) where impurities added to the semiconductor wafer W may not be diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the lower radiation thermometer 20 reaches the preheating temperature T1, the controller 3 adjusts the output from the halogen lamps HL to maintain the temperature of the semiconductor wafer W at approximately the preheating temperature T1.

When preheating is performed using the halogen lamps HL as described above, the entire semiconductor wafer W is uniformly increased in temperature to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen lamp house 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL irradiate the front surface of the semiconductor wafer W with a flash of light at the point in time when a predetermined time period elapses after the temperature of the semiconductor wafer W reaches the preheating temperature T1. At this time, a part of the flash of light emitted from the flash lamps FL travels directly toward the interior of the treatment chamber 6, and a part of the remainder of the flash of light travels toward the interior of the treatment chamber 6 after reflected once from the reflector 52. The irradiation of the semiconductor wafer W with the flash of light described above achieves flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by irradiation with a flash of light from the flash lamps FL momentarily increases to a treatment temperature T2 of 1000° C. or higher. After the impurities implanted in the semiconductor wafer W are activated, the front surface temperature of the semiconductor wafer W decreases rapidly. The upper radiation thermometer 25 measures front surface temperature of the semiconductor wafer W at the time of irradiation with a flash of light. Flash heating enables increasing and decreasing the front surface temperature of the semiconductor wafer W in an extremely short time, so that impurities implanted into the semiconductor wafer W can be activated while diffusion of the impurities due to heat is suppressed. A time required for activation of the impurities is extremely short as compared with a time required for thermal diffusion thereof, so that the activation is completed even in a short time of the order of from 0.1 milliseconds to 100 milliseconds, where no diffusion occurs.

After a predetermined time period has elapsed since the completion of the flash heating treatment, the halogen lamps HL turn off. This causes the temperature of the semiconductor wafer W to decrease rapidly from the preheating temperature T1. The lower radiation thermometer 20 measures the temperature of the semiconductor wafer W during decrease in temperature, and a result of the measurement is transmitted to the controller 3. The controller 3 monitors whether the temperature of the semiconductor wafer W decreases to a predetermined temperature based on the result of the measurement with the lower radiation thermometer 20. After the temperature of the semiconductor wafer W decreases to the predetermined temperature or below, the pair of transfer arms 11 of the transfer mechanism 10 is moved horizontally again from the retracted position to the transfer operation position and is then moved upwardly. This causes the lift pins 12 to protrude from the upper surface of the susceptor 74 to receive the heat-treated semiconductor wafer W from the susceptor 74. Subsequently, the transport opening 66 having been closed is opened by the gate valve 185, and the transport hand 151b (or the transport hand 151a) of the transport robot 150 transports the treated semiconductor wafer W placed on the lift pins 12 to the outside. The transport robot 150 moves the transport hand 151b forward to a position lying immediately under the semiconductor wafer W thrust upwardly by the lift pins 12, and stops the transport hand 151b thereat. Then, as the pair of transfer arms 11 descends, the semiconductor wafer W after the flash heating is delivered to the transport hand 151b and mounted thereon. After that, the transport robot 150 retracts the transport hand 151b from the treatment chamber 6 to transport out the treated semiconductor wafer W.

Next, measurement of front surface temperature of a semiconductor wafer W will be described in more detail. The front surface temperature of a semiconductor wafer W is measured by the upper radiation thermometer 25. To measure the front surface temperature of a semiconductor wafer W with the upper radiation thermometer 25, emissivity of the front surface of the semiconductor wafer W (apparent emissivity as viewed from the upper radiation thermometer 25) is required to be set in the upper radiation thermometer 25. The front surface of a semiconductor wafer W to be a product is typically formed with thin films in multiple layers in many cases. Although the upper radiation thermometer 25 has a small measurement angle, thin films layered on the front surface of a semiconductor wafer W in multiple layers also cause emissivity of the front surface to vary depending on a state of the multilayer film. For this reason, the first preferred embodiment allows the front surface temperature of a semiconductor wafer W to be measured as follows.

Figure 11:
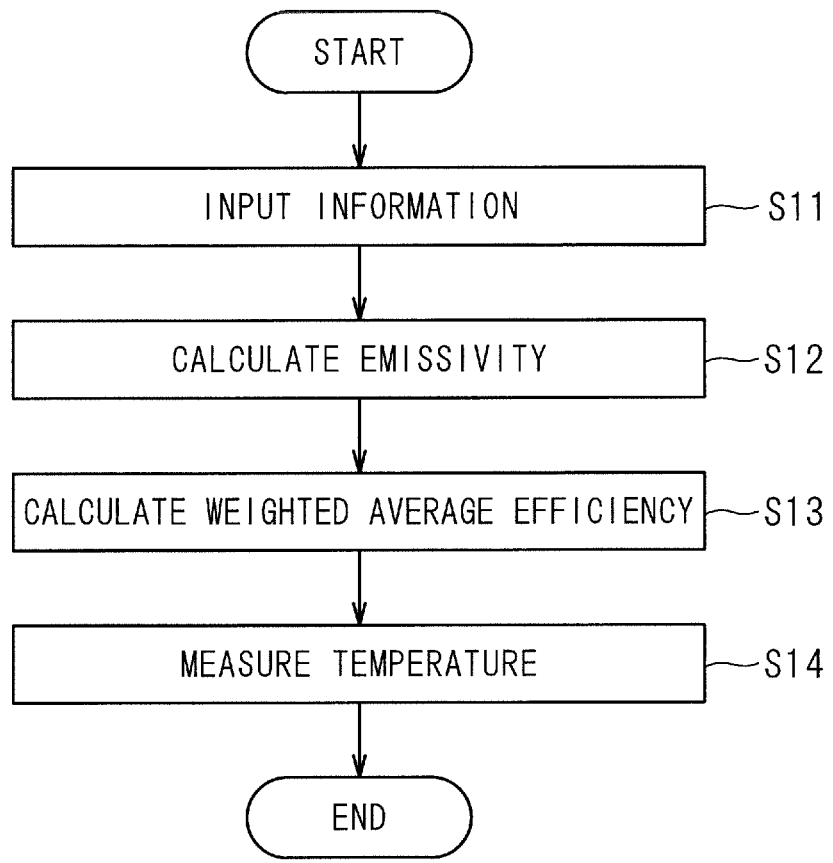
FIG. 11 is a flowchart illustrating a temperature measurement procedure according to a first preferred embodiment.

FIG. 11 is a flowchart illustrating a temperature measurement procedure according to the first preferred embodiment. In the first preferred embodiment, before treatment of a semiconductor wafer W to be treated in the heat treatment apparatus 100 is started, an operator of the apparatus sets and inputs various kinds of information from the input part 33 (step S11). The operator may input the various kinds of information at any time before the treatment of the semiconductor wafer W in the heat treatment apparatus 100 is started, e.g., at the time when the carrier C housing the semiconductor wafer W is placed on the load port 110.

FIG. 12 is a diagram illustrating an example of an information input screen. In the present preferred embodiment, a touch panel is used as the input part 33 and the display part 34, the touch panel having both functions thereof. FIG. 12 illustrates an example of an input screen displayed on the touch panel. The operator inputs film information on thin films formed on the front surface of the semiconductor wafer W, substrate information on the semiconductor wafer W itself, and device information on the upper radiation thermometer 25 from the input screen illustrated in FIG. 12.

The film information includes a film type, a film thickness, and a layer structure of the thin films formed on the front surface of the semiconductor wafer W. Specifically, the operator inputs the film type (Type) and the film thickness (Thin) of each of the thin films formed in multiple layers on the front surface of the semiconductor wafer W from the items of "Layer 1" to "Layer 4" in FIG. 12. The operator also inputs the number of repetitions of "Layer 1" to "Layer 4" in the multilayer film as a layer structure from the item of "Cycle time". The example of FIG. 12 shows that a thin film of silicon nitride (SiN) with a film thickness of 15 nm and a thin film of silicon dioxide ($SiO_2$) with a film thickness of 15 nm are alternately formed into four layers, and the four layers are formed 25 times, totaling 100 layers.

The substrate information includes a type of base material of the semiconductor wafer W formed with the multilayer film. Specifically, the operator inputs the type of base material of the semiconductor wafer W from the item of "Subst" in FIG. 12. The example of FIG. 12 shows that silicon (Si) is input as the type of base material of the semiconductor wafer W.

The device information includes an installation angle of the upper radiation thermometer 25. The installation angle of the upper radiation thermometer 25 is an angle of the optical axis of the infrared sensor 29 of the upper radiation thermometer 25 with respect to the normal line to the main surface of the semiconductor wafer W. Specifically, the installation angle of the upper radiation thermometer 25 is input from the item of "Angle" in FIG. 12. The installation angle of the upper radiation thermometer 25 is a fixed parameter of the apparatus, and thus may be set as a fixed value without being input one by one.

Next, the emissivity calculating part 32 of the controller 3 calculates emissivity of the front surface of the semiconductor wafer W based on the various kinds of information set and input (step S12). Specifically, when the operator selects "Calculation" in FIG. 12, the emissivity calculating part 32 performs an arithmetic process based on the various kinds of information set and input to calculate the emissivity of the front surface of the semiconductor wafer W. The semiconductor wafer W formed with the thin films has a reflectance that is calculated using a known theoretical formula such as Fresnel's formula based on the above various kinds of information. The emissivity calculating part 32 calculates the emissivity of the semiconductor wafer W by subtracting the calculated reflectance from 1 (assuming that the semiconductor wafer W has a transmittance of 0). The emissivity of the front surface of the semiconductor wafer W calculated based on the various kinds of information in step S12 is an apparent emissivity as viewed from the installation angle of the upper radiation thermometer 25. In step S12, spectral emissivity of the front surface of the semiconductor wafer W in a wavelength range including at least a measurement wavelength range of 5 μm to 6.5 μm of the upper radiation thermometer 25 is calculated.

Figure 13:
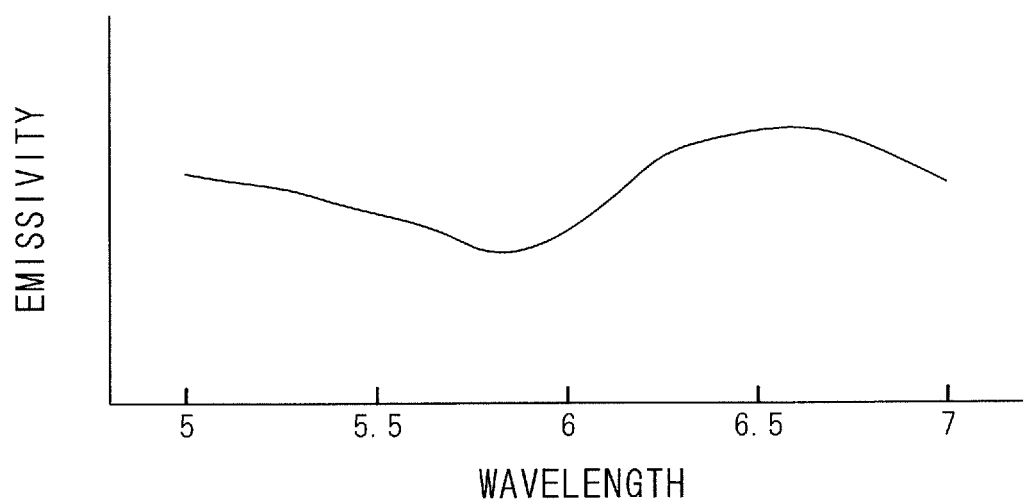
FIG. 13 is a graph showing an example of spectral emissivity of a semiconductor wafer.

Next, the emissivity calculating part 32 calculates a weighted average efficiency of the emissivity of the front surface of the semiconductor wafer W determined in step S12 (step S13). FIG. 13 is a graph showing an example of the spectral emissivity of the front surface of the semiconductor wafer W determined in step S12. FIG. 14 is a graph showing a sensitivity distribution of the upper radiation thermometer 25. As shown in FIG. 14, the measurement wavelength range of 5 μm to 6.5 μm of the upper radiation thermometer 25 includes a wavelength range of 6 μm to 6.5 μm having a sensitivity lower than that in a wavelength range of 5 μm to 6 μm. That is, the wavelength range of 5 μm to 6 μm is more important for temperature measurement using the upper radiation thermometer 25. For this reason, the emissivity calculating part 32 corrects the spectral emissivity shown in FIG. 13 based on the sensitivity distribution of the upper radiation thermometer 25 as shown in FIG. 14. As a result, the spectral emissivity of the front surface of the semiconductor wafer W after corrected as shown in FIG. 15 is determined. The emissivity calculating part 32 calculates an average value of the spectral emissivity in a measurement wavelength range of 5 μm to 6.5 μm of the upper radiation thermometer 25 from the spectral emissivity after corrected shown in FIG. 15. That is, the emissivity calculating part 32 calculates a weighted average efficiency of the emissivity of the front surface of the semiconductor wafer W based on the sensitivity distribution of the upper radiation thermometer 25.

After that, the upper radiation thermometer 25 measures the front surface temperature of the semiconductor wafer W (step S14). At this time, the weighted average efficiency of the emissivity of the front surface of the semiconductor wafer W calculated in step S13 is set in the upper radiation thermometer 25. The upper radiation thermometer 25 measures the front surface temperature of the semiconductor wafer W heated by irradiation with a flash of light, using the weighted average efficiency of the emissivity.

In the first preferred embodiment, the film information about the thin film formed on the front surface of the semiconductor wafer W, the substrate information about the semiconductor wafer W, and the installation angle of the upper radiation thermometer 25 are set and input. Then, an accurate emissivity of the front surface of the semiconductor wafer W formed with the multilayer film is determined based on various kinds of information thereabout. This emissivity is an apparent emissivity as viewed from the upper radiation thermometer 25. Then, the upper radiation thermometer 25 measures the front surface temperature of the semiconductor wafer W heated by irradiation with a flash of light, using the emissivity determined. The upper radiation thermometer 25 measures the front surface temperature using the emissivity accurately calculated based on the film information, etc., so that temperature of the semiconductor wafer W even formed with thin films in multiple layers can be accurately measured. As a result, a maximum reached temperature (treatment temperature T2) of the front surface of the semiconductor wafer W at the time of irradiation with a flash of light can be accurately measured.

Further, a weighted average efficiency of the emissivity of the front surface of the semiconductor wafer W is determined based on the sensitivity distribution of the upper radiation thermometer 25, and the upper radiation thermometer 25 measures the front surface temperature using the weighted average efficiency. This enables the upper radiation thermometer 25 to measure more accurately the front surface temperature of the semiconductor wafer W.

Second Preferred Embodiment

Next, a second preferred embodiment according to the present invention will be described. A heat treatment apparatus according to the second preferred embodiment is identical in configuration with that according to the first preferred embodiment. A treatment procedure for a semiconductor wafer W in the second preferred embodiment is also identical with that according to the first preferred embodiment. The second preferred embodiment is different from the first preferred embodiment in a method for calculating emissivity of a semiconductor wafer W.

FIG. 16 is a flowchart illustrating a temperature measurement procedure according to the second preferred embodiment. In the second preferred embodiment, a database DB (FIG. 10) showing a correlation between the reflectance of the semiconductor wafer W and the film information is created prior to the temperature measurement of the semiconductor wafer W. Specifically, a reflectance of a silicon semiconductor substrate formed with thin films of various types and with various thicknesses is individually determined by simulation. Then, the reflectance determined and the film types and film thicknesses of the thin films set as simulation conditions are associated with each other and registered in the database DB. The database DB created is stored on a magnetic disk 35 that is a storage part of the controller 3. In the database DB, film types and film thicknesses of multiple thin films and reflectances are registered in association with each other.

In the second preferred embodiment, a reflectance of the semiconductor wafer W to be treated is measured (step S21). As described above, the semiconductor wafer W to be treated is transported into the alignment chamber 231 of the alignment part 230 for orientation adjustment. In the alignment chamber 231, the semiconductor wafer W is supported by the rotary support part 237. Light emitted from the light emitting part 300 of the reflectance measuring part 232 is reflected by the half mirror 236, and is emitted to the front surface of the semiconductor wafer W at an incidence angle of 0°. The light emitted from the light emitting part 300 is reflected from the front surface of the semiconductor wafer W. The reflected light passes through the half mirror 236, and is received by the light receiving part 235. The reflectance calculating part 31 of the controller 3 calculates the reflectance of the front surface of the semiconductor wafer W by dividing the intensity of the light reflected from the semiconductor wafer W and received by the light receiving part 235 by the intensity of the light emitted from the light emitting part 300. The reflectance of the semiconductor wafer W may be measured while the semiconductor wafer W supported by the rotary support part 237 is rotated by the rotary motor 238.

Next, the specifying part 36 of the controller 3 specifies the film information based on the reflectance of the semiconductor wafer W measured in step S21 (step S22). Specifically, the specifying part 36 extracts the film type and the film thickness associated with the reflectance measured in step S21 from the database DB. The film type and film thickness specified in this way are of the thin film formed on the semiconductor wafer W.

Various types of information other than the film type and the film thickness of the thin film are set and input in the same manner as in the first preferred embodiment. That is, the substrate information about the semiconductor wafer W, the installation angle of the upper radiation thermometer 25, and the layer structure of the thin film are set and input from the input part 33 by an operator.

Procedures in subsequent steps S23 to S25 are the same as those in steps S12 to S14 in the first preferred embodiment. First, the emissivity calculating part 32 of the controller 3 calculates the emissivity of the front surface of the semiconductor wafer W based on various kinds of information including the film information specified in step S22 (step S23). In step S21, the reflectance of the front surface of the semiconductor wafer W is measured. This reflectance is in the visible light range, and thus is different from reflectance in the measurement wavelength range of the upper radiation thermometer 25 (5 µm to 6.5 µm). Thus, the emissivity in the measurement wavelength range of the upper radiation thermometer 25 cannot be determined only by subtracting the reflectance measured in step S21 from 1. For this reason, the emissivity of the front surface of the semiconductor wafer W is calculated based on various kinds of information including the film information of the thin film, as in the first preferred embodiment.

Next, the emissivity calculating part 32 calculates a weighted average efficiency of the emissivity of the front surface of the semiconductor wafer W (step S24). Here, the emissivity calculating part 32 calculates the weighted average efficiency of the emissivity of the front surface of the semiconductor wafer W based on the sensitivity distribution of the upper radiation thermometer 25 in the same manner as in the first preferred embodiment. Then, the upper radiation thermometer 25 measures the front surface temperature of the semiconductor wafer W (step S25).

In the second preferred embodiment, the film type and film thickness of the thin film formed on the front surface of the semiconductor wafer W are not input, but are specified based on the reflectance of the semiconductor wafer W. Then, an accurate emissivity of the front surface of the semiconductor wafer W formed with the multilayer film is determined based on various kinds of information including the specified film type and film thickness. The upper radiation thermometer 25 measures the front surface temperature of the semiconductor wafer W heated by irradiation with a flash of light, using the emissivity determined. As in the first preferred embodiment, the upper radiation thermometer 25 measures the front surface temperature using the emissivity accurately calculated based on the film information, etc., so that temperature of the semiconductor wafer W even formed with thin films in multiple layers can be accurately measured. As a result, a maximum reached temperature (treatment temperature T2) of the front surface of the semiconductor wafer W at the time of irradiation with a flash of light can be accurately measured.

Third Preferred Embodiment

Next, a third preferred embodiment of the present invention will be described. A heat treatment apparatus according to the third preferred embodiment is identical in configuration with that according to the first preferred embodiment. A treatment procedure for a semiconductor wafer W in the third preferred embodiment is also identical with that according to the first preferred embodiment. In the third preferred embodiment, a maximum reached temperature of the front surface of the semiconductor wafer W is predicted before irradiation with a flash of light, using the emissivity determined in the first preferred embodiment or the second preferred embodiment.

The maximum reached temperature on the front surface of the semiconductor wafer W at the time of irradiation with a flash of light depends on voltage applied to the flash lamps FL. The accurate emissivity determined in the first preferred embodiment or the second preferred embodiment is set in the upper radiation thermometer 25, and the upper radiation thermometer 25 measures the maximum reached temperature on the front surface of the semiconductor wafer W at the time of irradiation with a flash of light by applying several patterns of voltage to the flash lamps FL. This allows a correlation between the voltage applied to the flash lamps FL and the maximum reached temperature on the front surface of the semiconductor wafer W at the time of irradiation with a flash of light to be determined in advance.

When the semiconductor wafer W is treated, the voltage to be applied to the flash lamps FL is specified for each wafer. The temperature predicting part 39 of the controller 3 predicts the maximum reached temperature of the front surface of the semiconductor wafer W at the time of irradiation with a flash of light based on the voltage applied and the correlation described above. The actual temperature of the semiconductor wafer W measured by the upper radiation thermometer 25 set with the accurate emissivity determined in the first preferred embodiment or the second preferred embodiment has good consistency with the predicted temperature thereof.

<Modification>

While the preferred embodiments according to the present invention are described above, various modifications of the present invention in addition to those described above may be made without departing from the scope and spirit of the present invention. For example, although in the above preferred embodiments, the emissivity of the front surface of the semiconductor wafer W viewed from the upper radiation thermometer 25 is calculated, emissivity of the back surface of the semiconductor wafer W viewed from the lower radiation thermometer 20 may be calculated. In this case, the emissivity of the back surface of the semiconductor wafer W is determined based on the film information about the thin film formed on the back surface of the semiconductor wafer W, the substrate information about the semiconductor wafer W, and various kinds of information about the installation angle of the lower radiation thermometer 20. Although thin films are less likely to be formed in multiple layers on the back surface of the semiconductor wafer W as compared with the front surface thereof, back surface temperature of the semiconductor wafer W can be accurately measured by the lower radiation thermometer 20 by determining emissivity of the back surface of the semiconductor wafer W in the same manner as in the above preferred embodiments and setting the emissivity in the lower radiation thermometer 20.

Further, although in the above preferred embodiments, a weighted average efficiency of the emissivity of the front surface of the semiconductor wafer W is determined based on the sensitivity distribution of the upper radiation thermometer 25, the weighted average efficiency is not indispensable, and temperature of the front surface may be measured using the emissivity as it is, calculated based on various kinds of information, of the semiconductor wafer W. Even when the weighted average efficiency is not used, an average value of determined emissivity values of the semiconductor wafer W in a measurement wavelength range of 5 μm to 6.5 μm of the upper radiation thermometer 25 is calculated and is set in the upper radiation thermometer 25. This also enables the front surface temperature of the semiconductor wafer W to be accurately measured using the emissivity calculated based on various kinds of information including the film information and the like. However, when, as in the above embodiment, a weighted average efficiency of the emissivity of the front surface of the semiconductor wafer W is determined based on the sensitivity distribution of the upper radiation thermometer 25 and the weighted average efficiency is set in the upper radiation thermometer 25, the front surface temperature of the semiconductor wafer W can be measured more accurately.

Although the 30 flash lamps FL are provided in the flash lamp house 5 according to the aforementioned preferred embodiments, the present invention is not limited to this. Any number of flash lamps FL may be provided. The flash lamps FL are not limited to the xenon flash lamps, but may be krypton flash lamps. The number of halogen lamps HL provided in the halogen lamp house 4 is also not limited to 40, and any number of halogen lamps HL may be provided.

In the preferred embodiment described above, the filament-type halogen lamps HL are used as continuous lighting lamps that emit light continuously for one second or more to preheat the semiconductor wafer W. The present invention, however, is not limited to this. In place of the halogen lamps HL, discharge type arc lamps (e.g., xenon arc lamps) may be used as the continuous lighting lamps to perform the preheating.

A substrate to be treated by the heat treatment apparatus 100 is not limited to a semiconductor wafer, and may be a glass substrate to be used for a flat panel display such as a liquid crystal display device, and a substrate for a solar cell.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for heating a substrate formed with a thin film by irradiating the substrate with a flash of light, the heat treatment method comprising the steps of:
   (a) calculating emissivity of said substrate as viewed from a radiation thermometer based on the following information;
      a material of said thin film formed on said substrate, a film thickness of said thin film and a layer structure of said thin film;
      a base material of said substrate; and
      an installation angle of said radiation thermometer that measures temperature of said substrate;
   (b) calculating a weighted average efficiency of the emissivity of said substrate based on a sensitivity distribution in a measurement wavelength of said radiation thermometer, and
   (c) setting said weighted average efficiency of said emissivity calculated in said step (b) in said radiation thermometer to measure the temperature of said substrate heated by irradiation with a flash of light using said radiation thermometer.

2. The heat treatment method according to claim 1, before said step (a) further comprising the step of:
   (d) setting and inputting a material of said thin film, a film thickness of said thin film and a layer structure of said thin film, and a base material of said substrate.

3. The heat treatment method according to claim 1, before performing said step (a), further comprising the steps of:
   (e) measuring reflectance of said substrate; and
   (f) specifying a material of said thin film, a film thickness of said thin film and a layer structure of said thin film based on the reflectance of said substrate.

* * * * *